United States Patent
Nakamura et al.

(10) Patent No.: US 9,449,696 B2
(45) Date of Patent: Sep. 20, 2016

(54) DIRECT-TRANSFER MARCHING MEMORY AND A COMPUTER SYSTEM USING THE SAME

(71) Applicants: Tadao Nakamura, Miyagi (JP); Michael J. Flynn, Palo Alto, CA (US)

(72) Inventors: Tadao Nakamura, Miyagi (JP); Michael J. Flynn, Palo Alto, CA (US)

( * ) Notice: Subject to any disclaimer, the term of this patent is extended or adjusted under 35 U.S.C. 154(b) by 0 days.

(21) Appl. No.: 14/877,557

(22) Filed: Oct. 7, 2015

(65) Prior Publication Data

US 2016/0118124 A1    Apr. 28, 2016

Related U.S. Application Data

(63) Continuation of application No. PCT/JP2014/003145, filed on Jun. 12, 2014.

(51) Int. Cl.
| | | |
|---|---|---|
| *G11C 16/04* | (2006.01) | |
| *G11C 16/10* | (2006.01) | |
| *G11C 19/28* | (2006.01) | |
| *G11C 19/18* | (2006.01) | |
| *G11C 16/32* | (2006.01) | |

(52) U.S. Cl.
CPC .............. *G11C 16/10* (2013.01); *G11C 16/32* (2013.01); *G11C 19/184* (2013.01); *G11C 19/28* (2013.01); *G11C 19/282* (2013.01)

(58) Field of Classification Search
CPC ..... G11C 16/10; G11C 16/32; G11C 19/184; G11C 19/28; G11C 19/282
USPC .................................................... 365/185.28
See application file for complete search history.

(56) References Cited

U.S. PATENT DOCUMENTS

| 4,972,370 A | 11/1990 | Morimoto et al. | |
|---|---|---|---|
| 8,949,650 B2 * | 2/2015 | Nakamura | G06F 5/08 713/400 |
| 9,025,407 B2 * | 5/2015 | Barkley | G11C 5/14 365/207 |
| 9,164,837 B2 * | 10/2015 | Gaertner | G06F 11/1068 |
| 2015/0235676 A1 * | 8/2015 | Barkley | G11C 5/147 365/227 |

FOREIGN PATENT DOCUMENTS

| JP | 0465869 A | 3/1992 |
|---|---|---|
| JP | 04257233 A | 9/1992 |
| WO | 2011010445 A1 | 1/2011 |

OTHER PUBLICATIONS

PCT Written Opinion of the International Searching Authority, Intl. Application No. PCT/JP2014/003145, dated Aug. 19, 2014, 4 pages.
Abstract of JPH0465869 (A), published Mar. 2, 1992, 2 pages.
Abstract of JPH04257233 (A), published Sep. 11, 1992, 1 page.

* cited by examiner

*Primary Examiner* — Pho M Luu
(74) *Attorney, Agent, or Firm* — Barley Snyder

(57) ABSTRACT

A direct-transfer marching memory includes an array of memory units, each of the memory units having a sequence of bit-level cells so as to store information of byte size or word size, the information of byte size or word size is transferred synchronously, step by step, along a direction orthogonal to a direction of the sequence of bit-level cells, each of the bit-level cells encompassing an electron-storage region configured to accumulate cell-electrons. The cell-electrons accumulated in an electron-storage region in a subject memory unit is directly transferred to an adjacent electron-storage region, which is assigned in the next memory unit adjacent to the subject memory unit, the transfer of the cell-electrons is directly controlled by control signals, without using a combinational function of a logic gate circuit.

18 Claims, 24 Drawing Sheets

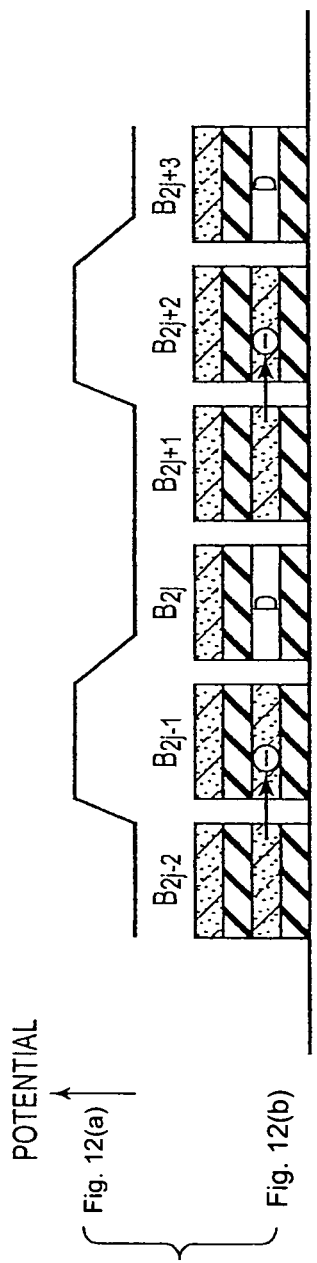

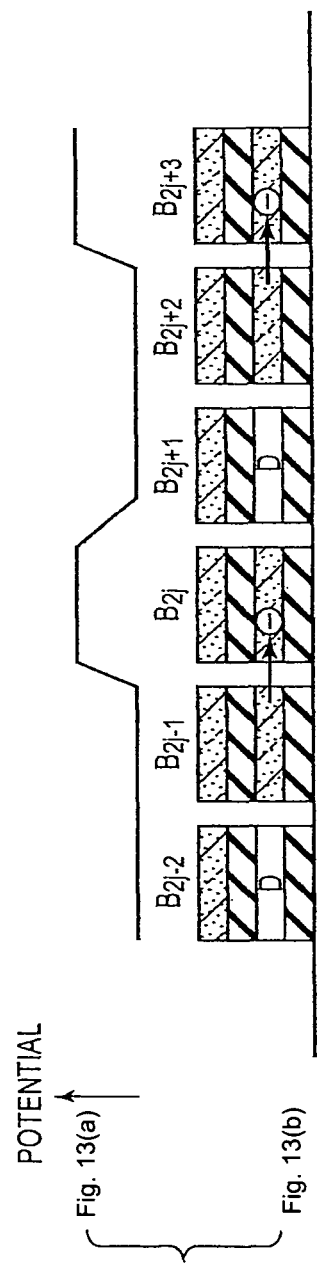

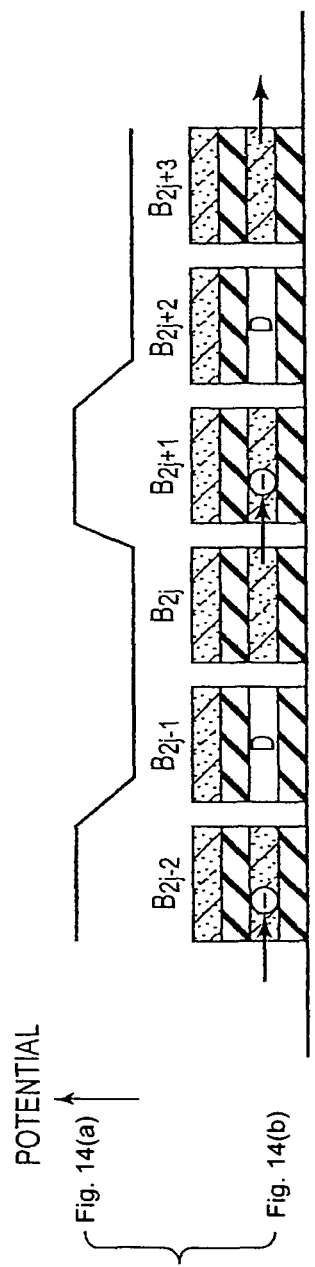

DIRECT-TRANSFER MARCHING MEMORY AND A COMPUTER SYSTEM USING THE SAME

CROSS-REFERENCE TO RELATED APPLICATIONS

This application is a continuation of PCT International Application No. PCT/JP2014/003145 filed Jun. 12, 2014, which claims priority under 35 U.S.C. §119(a)-(d) of U.S. patent application Ser. No. 61/834,443 filed Jun. 13, 2013.

FIELD OF THE INVENTION

The present invention pertains to a structure of a new kind of marching memory adapted for computer systems which operate at low energy consumption and high speed and further the present invention pertains to a computer system using the new kind of marching memory.

BACKGROUND

The inventors of the present invention have already proposed a marching-memory computer organization encompassing a processor and a new main memory called "a marching main memory" (See WO 2011/010445A1). The processor of the proposed marching-memory computer recited in WO 2011/010445A1 includes a control unit having a clock generator configured to generate a clock signal and an arithmetic logic unit configured to execute arithmetic and logic operations synchronized with the clock signal. In addition, the proposed marching main memory encompasses an array of memory units, usually called locations. Each of the memory units has a unit of information of byte size or word size and input terminals of the array and output terminals of the array. The proposed marching main memory stores information in each of the memory units and transfers synchronously with the clock signal, step by step, toward the output terminals, so as to provide the processor with the stored information actively and sequentially so that the arithmetic logic unit can execute the arithmetic and logic operations with the stored information. In addition, the results of the processing in the arithmetic logic unit are sent out to the marching main memory, except that in case of instructions movement, there is only one way of instructions flow from the marching main memory to the processor.

In accordance with the marching-memory computer architecture, recited in WO 2011/010445A1, because each of the memory units in the array of memory units, which implement the marching main memory, has a sequence of bit-level cells so as to store information of byte size or word size, the information of byte size or word size is transferred along the horizontal data-transfer lines synchronously with clock signals, step by step, and therefore random access operation of the individual bit-level cells is not required in the marching main memory. Then, since bottlenecks ascribable to wirings between processor chips and the conventional main memory chips or conventional cache memory chips, and bottlenecks between all of the units in a parallel processor, these bottlenecks are inherently existing in conventional computer system, can be removed, a very high speed operation with a very low power consumption can be achieved.

In the marching-memory computer proposed in WO 2011/010445A1, the way of transferring information of byte size or word size, which is assisted by clocked AND operation, is proposed as an example. To establish the combinational function of the clocked AND gate, a plurality of transistors is required in each of the bit-level cells and the operation of the marching-memory is accompanied by delays in the clocked AND gate.

SUMMARY

An object of the present invention is to provide a new scheme of a marching memory with synchronous system, in which the information of byte size or word size can be transferred directly, along the horizontal data-transfer lines, synchronously controlled by control signals, step by step, without being assisted by the combinational function of logic gate circuits such as the function of the AND gate, thereby simplifying the structure of the marching memory.

A direct-transfer marching memory, constructed in accordance with the present invention, includes an array of memory units with each memory unit having a sequence of bit-level cells. Each bit level cell has an electron-storage region configured to accumulate cell-electrons and stores byte size or word size information. This direct-transfer marching memory also includes circuitry that transfers the byte size or word size information synchronously, step by step, along a direction orthogonal to a direction of the sequence of bit-level cells. A direct-transfer marching memory, constructed in accordance with the present invention, further includes a source of control signals that directly transfer cell-electrons accumulated in an electron-storage region in a memory unit to an adjacent electron-storage region in the next adjacent memory unit without using a combinational function of a logic gate circuit. The transfer of the cell-electrons may be established by quantum tunneling of electrons through an insulator disposed between the one of the electron-storage regions and the adjacent electron-storage region, or alternatively, established by another mechanism such as the classical electron transport mechanism, similar to the mechanism employed in charge-coupled devices (CCD).

A second aspect of the present invention inheres in a computer system encompassing a processor and a direct-transfer marching main memory configured to provide the processor with stored information actively and sequentially so that the processor can execute arithmetic and logic operations with the stored information. The direct-transfer marching main memory includes an array of memory units, with each of the memory units having a sequence of bit-level cells so as to store information of byte size or word size. Each of the bit-level cells encompasses an electron-storage region configured to accumulate cell-electrons. The cell-electrons accumulated in one of the electron-storage regions in a memory unit are directly transferred to an adjacent electron-storage region in the next adjacent memory unit. The transfer of the cell-electrons is directly controlled by control signals, without using a combinational function of a logic gate circuit. The transfer of the cell-electrons may be established by quantum tunneling of electrons through an insulator disposed between the one of the electron-storage regions and the adjacent electron-storage region, or established by another mechanism such as the classical electron transport mechanism

BRIEF DESCRIPTION OF THE DRAWINGS

FIG. 4(c) illustrates a trivalent waveforms of a control signal CLOCK3, each of which swings between trivalent levels of low (L), medium (M) and high (H) levels at different phases, respectively, and illustrate that the three control signals CLOCK1, CLOCK2 and CLOCK3 implement triple phase ternary clocks;

FIG. 12 (a) illustrates a triple phase potential profile of the control electrodes with binary clock signals at a time interval between t0 and t1, and FIG. 12 (b) illustrates the corresponding quantum tunneling between the adjacent floating-gate electrodes, assigning an ideal dummy cell, in which electrons are completely depleted, in a set of three adjacent floating-gate electrodes, respectively, each of ideal dummy cells proceeds with cell-electrons, in the direct-transfer marching memory pertaining to the embodiment of the present invention;

FIG. 13 (a) illustrates a triple phase potential profile of the control electrodes with binary clock signals at a time interval between t1 and t2, and FIG. 13 (b) illustrates the corresponding quantum tunneling between the adjacent floating-gate electrodes, assigning an ideal dummy cell, in which electrons are completely depleted, in a set of three adjacent floating-gate electrodes, respectively, each of ideal dummy cells proceeds with cell-electrons, in the direct-transfer marching memory pertaining to the embodiment of the present invention;

FIG. 14 (a) illustrates a triple phase potential profile of the control electrodes with binary clock signals at a time interval between t2 and t3, and FIG. 14 (b) illustrates the corresponding quantum tunneling between the adjacent floating-gate electrodes, assigning an ideal dummy cell, in which electrons are completely depleted, in a set of three adjacent floating-gate electrodes, respectively, each of ideal dummy cells proceeds with cell-electrons, in the direct-transfer marching memory pertaining to the embodiment of the present invention;

FIG. 15 (a) illustrates a binary waveform of a control signal CLOCK1, FIG. 15 (b) illustrates a binary waveform of a control signal CLOCK2.

FIG. 19(c) illustrates a trivalent waveforms of a control signal CLOCK3, each of which swings between trivalent levels of low (L), medium (M) and high (H) levels at different phases, respectively, and illustrate that the three control signals CLOCK1, CLOCK2 and CLOCK3 implement triple phase ternary clocks, adapted for the direct-transfer reverse marching memory pertaining to the embodiment of the present invention;

DETAILED DESCRIPTION OF THE EMBODIMENT(S)

Figure 1:
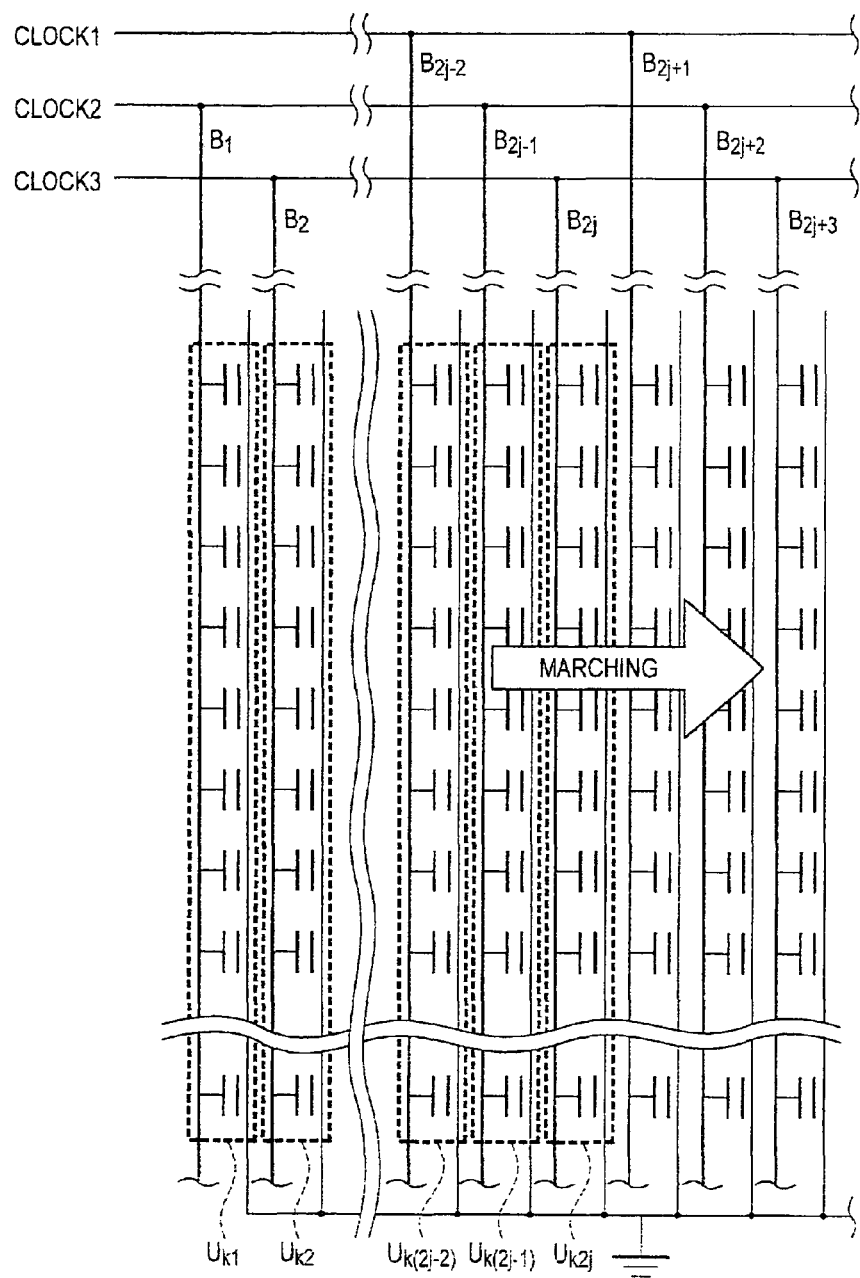
FIG. 1 illustrates an example of a circuit-level representation of an array of memory-units arrays, in which a plurality of bit-level cells are aligned along a vertical direction, each of the arrays of bit-level cells implements one of the memory-units, which is respectively controlled by one of the control lines assigned to the memory-units so as to implement a direct-transfer marching memory pertaining to an embodiment of the present invention.

Various embodiments of the present invention will be described with reference to the accompanying drawings. It is to be noted that the same or similar reference numerals are applied to the same or similar parts and elements throughout the drawings and the description of the same or similar parts and elements will be omitted or simplified. Generally, and as it is conventional in the representation of semiconductor devices, it will be appreciated that the various drawings are not drawn to scale from one figure to another, nor inside a given figure and, in particular, that the layer thicknesses are arbitrarily drawn for facilitating the reading of the drawings. In the following description, specific details are set forth, such as specific materials, processes and equipment in order to provide a thorough understanding of the present invention. It will be apparent, however, to one skilled in the art that the present invention may be practiced without these specific details. In other instances, well-known manufacturing materials, processes and equipment are not set forth in detail in order not to unnecessarily obscure the present invention. Prepositions, such as "on", "over", "under", "beneath" and "normal" are defined with respect to a planar surface of the substrate, regardless of the orientation in which the substrate is actually held. A layer is on another layer even if there are intervening layers.

Figure 16:
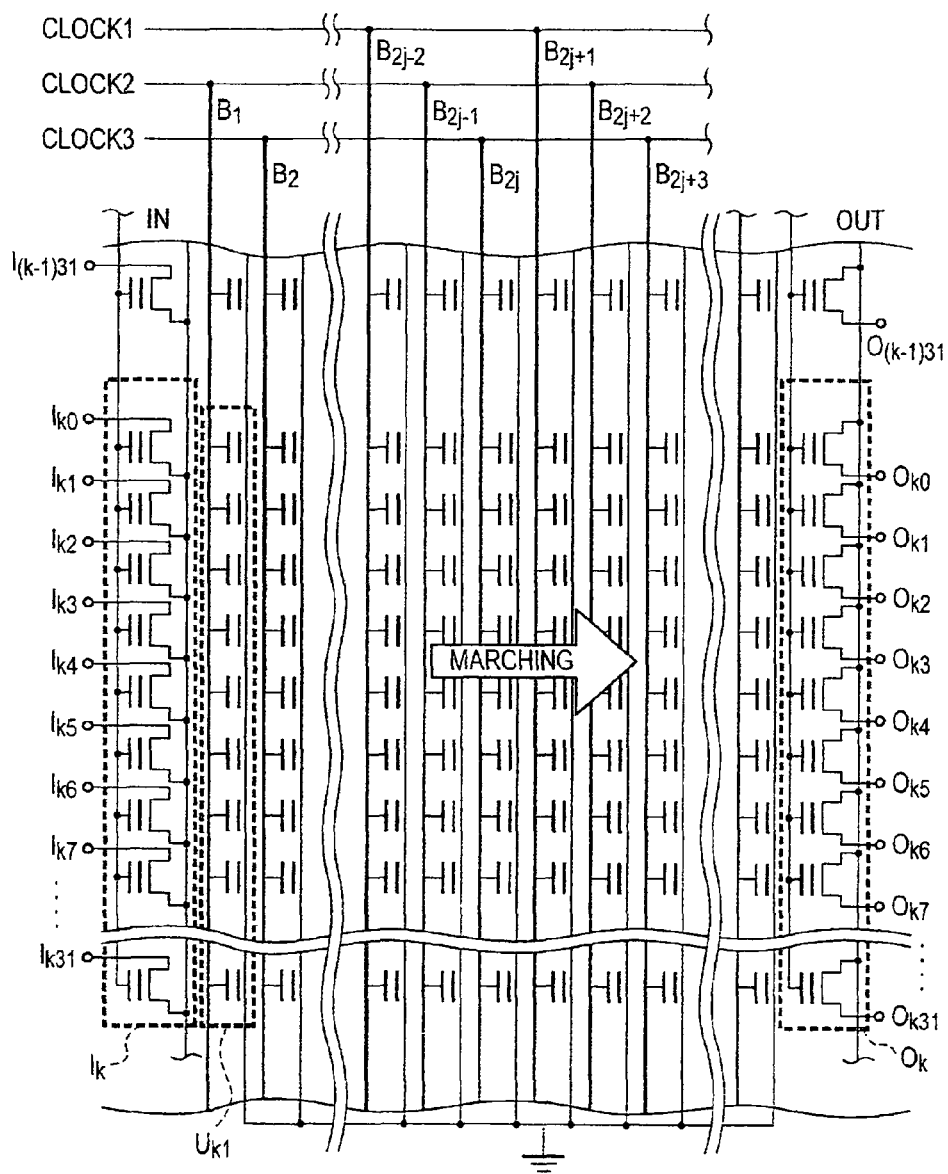
FIG. 16 illustrates an example of a circuit-level representation of an input-terminal column and an output-terminal column, in which a plurality of input storage transistors or output-terminal transistors are aligned along a vertical direction, which are adapted for the direct-transfer marching memory pertaining to an embodiment of the present invention.
Figure 17:
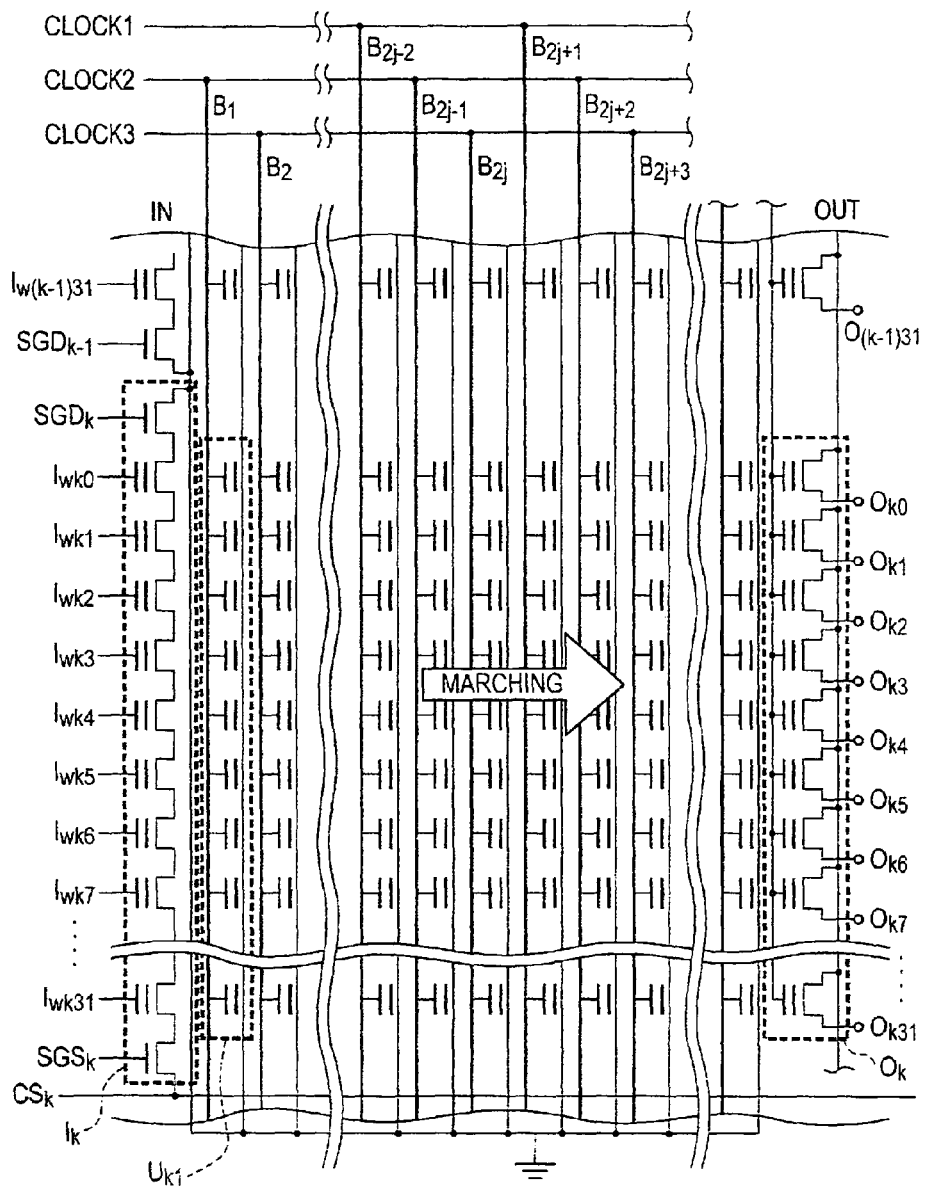
FIG. 17 illustrates another example of a circuit-level representation of an input-terminal column, in which a plurality of input storage transistors are aligned along a vertical direction, which can be adapted for the direct-transfer marching memory pertaining to an embodiment of the present invention.

Although nMOS FETs are illustrated as the input storage transistors and the output-terminal transistors in FIGS. 16 and 17, etc., pMOS FETs can be used as the input storage transistors and the output-terminal transistors, if the opposite polarity is employed.

Array of Memory Units

Figure 2:
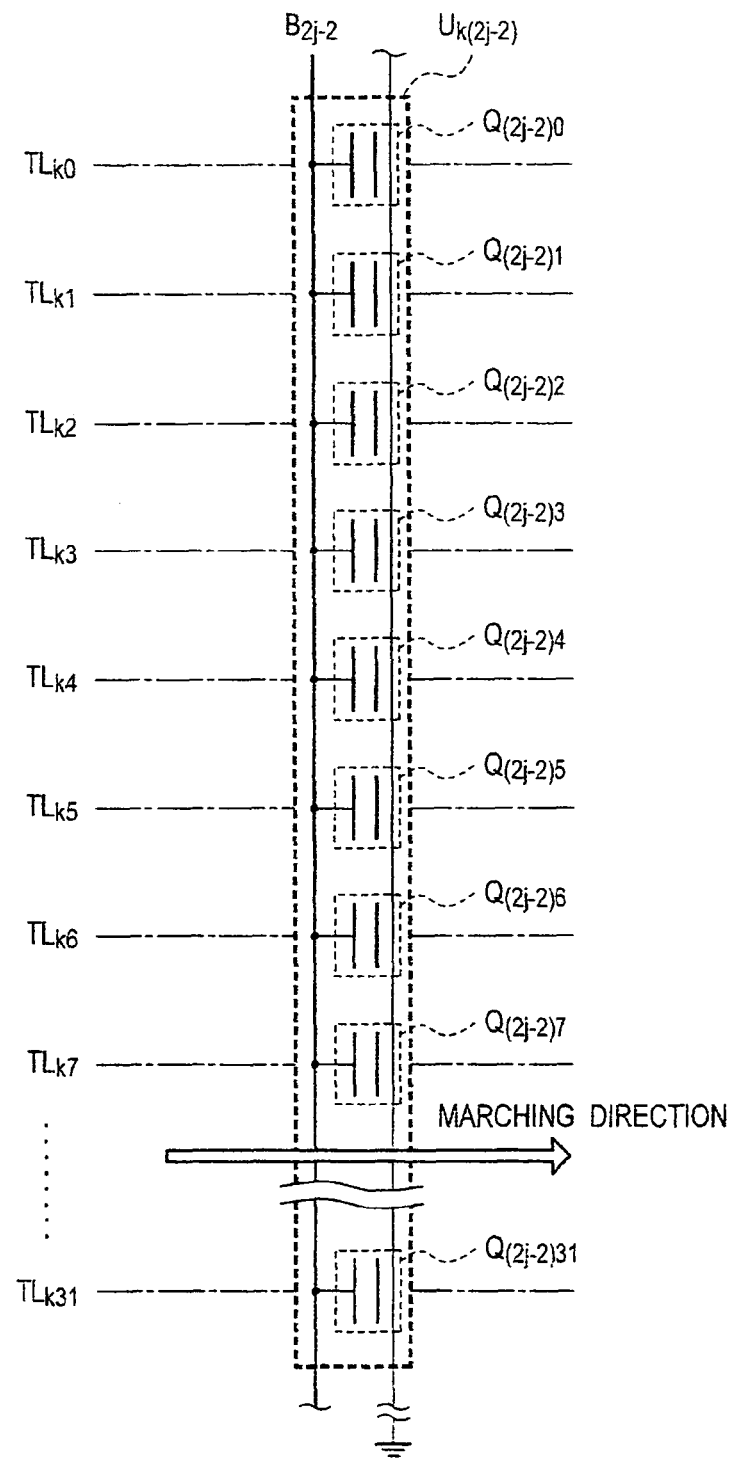
FIG. 2 illustrates a detailed internal configuration of a representative memory-unit, illustrating each of bit-level cells with reference numerals pertaining to an embodiment of the present invention.
Figure 5:
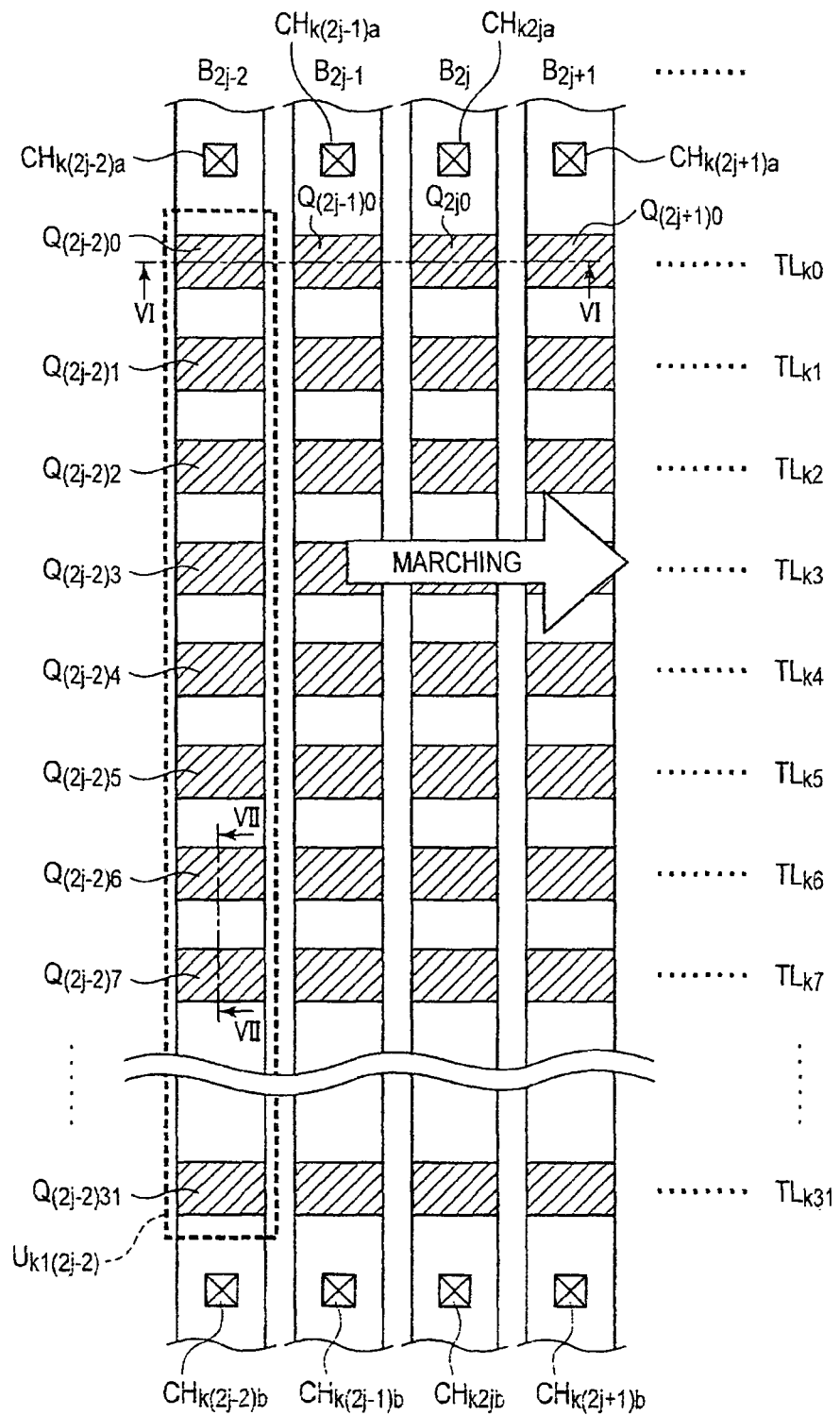
FIG. 5 illustrates a plan view of an actual array of memory-units on a semiconductor chip, which corresponds to a part of the circuit-level representation of the array of memory-units illustrated in FIG. 1.

As shown in FIGS. 1, 2, and 5, a direct-transfer marching memory pertaining to an embodiment of the present invention encompasses an array of memory units. In the array of memory units, a plurality of the control lines (vertical lines) B2$j$–2, B2$j$–1, B2$j$, B$k$(2$j$+1), . . . are defined along the column direction (vertical direction) and a plurality of horizontal data-transfer lines TL$k$0, TL$k$1, TL$k$2, TL$k$3, . . . TL$k$31 are defined along the row direction orthogonal to the control lines B2$j$–2, B2$j$–1, B2$j$, B$k$(2$j$+1), . . . . With the above definition of the column and row, a plurality of bit-level cells, each of the bit-level cells has electron-storage regions, respectively, are aligned along the column direction of FIG. 1 so as to implement a plurality of memory-units U$k$(2$j$–2), U$k$(2$j$–1), U$k$,2$j$, U$k$(2$j$+1), . . . . As illustrated in FIG. 2, the memory-unit U$k$(2$j$–2) encompasses, for example, thirty-two bit-level cells Q(2$j$–2)0, Q(2$j$–2)1, Q(2$j$–2)2, Q(2$j$–2)3, . . . Q(2$j$–2)31, and the thirty-two bit-level cells are aligned along the column direction, so as to implement a single memory unit U$k$(2$j$–2). Although detailed illustration with the similar reference numerals is omitted, the other memory-unit U$k$(2$j$–1), U$k$,2$j$, U$k$(2$j$+1), . . . illustrated in FIG. 1 have thirty-two bit-level cells, respectively, and the thirty-two bit-level cells are aligned along the column direction, so as to implement the other memory-unit U$k$(2$j$–1), U$k$,2$j$, U$k$(2$j$+1), . . . , similarly. The respective electron-storage states of the electron-storage regions assigned in each of the memory-units U$k$(2$j$–2), U$k$(2$j$–1), U$k$,2$j$, U$k$(2$j$+1), . . . are controlled by triple phase control signals CLOCK1, CLOCK2 and CLOCK3, which are applied through the control lines (vertical lines) B2$j$–2, B2$j$–1, B2$j$, B$k$(2$j$+1), . . . .

Figure 3:
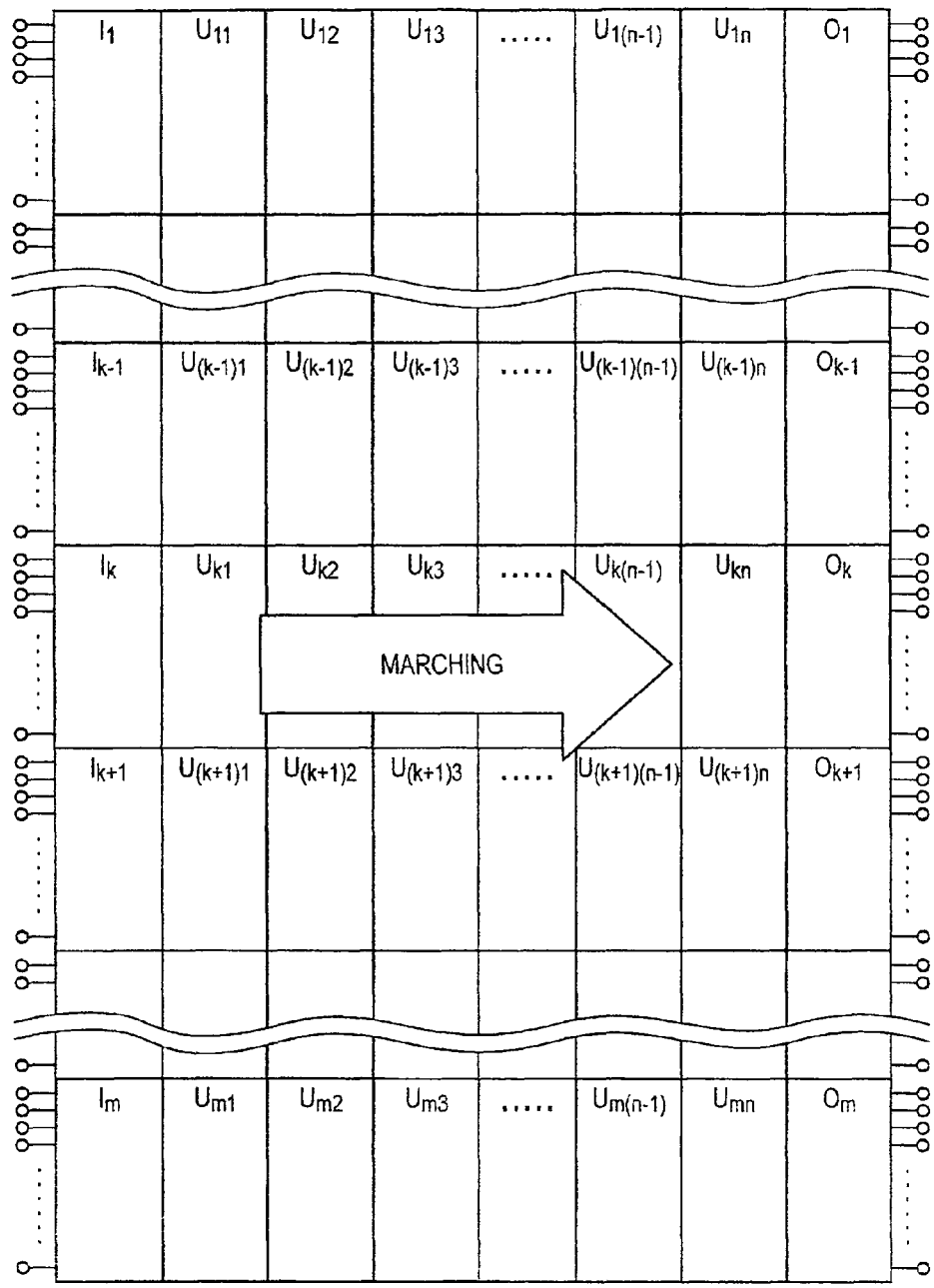
FIG. 3 illustrates a global array of memory units on a semiconductor chip, implementing a direct-transfer marching memory pertaining to the embodiment of the present invention.

Each of the memory units U11, U12, U1,2$j$, . . . , U1($n$–1), U1$n$, . . . ; U($k$–1)1, U($k$–1)2, U($k$–1),2$j$, . . . , U($k$–1)($n$–1), U($k$–1)$n$, . . . ; U$k$1, U$k$2, U$k$,2$j$, . . . , U$k$($n$–1), U$k$$n$, . . . ; U($k$+1)1, U($k$+1)2, U($k$+1),2$j$, . . . , U($k$+1)($n$–1), U($k$+1)$n$, . . . ; and U$m$1, U$m$2, U$m$,2$j$, . . . , U$m$($n$–1), U$m$$n$, . . . in the m*n matrix of memory units illustrated in FIG. 3 has a sequence of bit-level cells, respectively, so as to store information of byte size or word size and the information of byte size or word size is transferred along the horizontal data-transfer lines TL$k$0, TL$k$1, TL$k$2, TL$k$3, . . . TL$k$31 synchronously with triple phase control signals CLOCK1, CLOCK2 and CLOCK3, step by step, thereby establishing the marching behavior of the information of byte size or word size. As illustrated in FIG. 3, a sequence of input-terminal columns I1, . . . , I$k$–1, I$k$, I$k$+1, . . . , I$m$ is provided at the left end of the array, being disposed at the left side of the memory units U11, . . . , U($k$–1)1, U$k$,1, U($k$+1)1, . . . , U$m$1 and a sequence of output-terminal columns O1, . . . , O$k$–1, O$k$, O$k$+1, . . . , O$m$ is provided at the right end of the array, being disposed at the left side of the memory units U1$n$, . . . , U($k$–1)$n$, U$k$,$n$, U($k$+1)$n$, . . . , U$mn$.

According to the direct-transfer marching memory of the embodiment of the present invention illustrated in FIG. 3, the memory units U11, U12, U1,2$j$, . . . , U1($n$–1), U1$n$, . . . ; U($k$–1)1, U($k$–1)2, U($k$–1),2$j$, . . . , U($k$–1)($n$–1), U($k$–1)$n$, . . . ; U$k$1 , U$k$2, U$k$,2$j$, . . . , U$k$($n$–1), U$k$$n$, . . . ; U($k$+1)1, U($k$+1)2, U($k$+1),2$j$, . . . , U($k$+1)($n$–1), U($k$+1)$n$, . . . ; and U$m$1, U$m$2, U$m$,2$j$, . . . , U$m$($n$–1), U$mn$ are not required of the refreshment, because all of the memory units U11, U12, U1,2$j$, . . . , U1($n$–1), U1$n$, . . . ; U($k$–1)1, U($k$–1)2, U($k$–1),2$j$, . . . , U($k$–1)($n$–1), U($k$–1)$n$, . . . ; U$k$1, U$k$2, U$k$,2$j$, . . . , U$k$($n$–1), U$k$$n$, . . . ; U($k$+1)1, U($k$+1)2, U($k$+1),2$j$, . . . , U($k$+1)($n$–1), U($k$+1)$n$, . . . ; and U$m$1, U$m$2, U$m$,2$j$, . . . , U$m$($n$–1), U$mn$ are usually refreshed automatically due to the information-moving scheme (information-marching scheme). Then addressing to each of memory units U11, U12, U1,2$j$, . . . , U1($n$–1), U1$n$, . . . ; U($k$–1)1, U($k$–1)2, U($k$–1),2$j$, . . . , U($k$–1)($n$–1), U($k$–1)$n$, . . . ; U$k$1, U$k$2, U$k$,2$j$, . . . , U$k$($n$–1), U$k$$n$, . . . ; U($k$+1)1, U($k$+1)2, U($k$+1),2$j$, . . . , U($k$+1)($n$–1), U($k$+1)$n$, . . . ; and U$m$1, U$m$2, U$m$,2$j$, . . . , U$m$($n$–1), U$mn$ disappears and required information heads toward output-terminal columns O1, . . . , O$k$–1, O$k$, O$k$+1, . . . , O$m$ connected to the right edge of the memory as explained bellow. The mechanism of accessing the direct-transfer marching memory of the embodiment of the present invention is truly alternative to existing memory schemes that start from the addressing mode to read/write information in the conventional computer system. Therefore, according to the direct-transfer marching memory of the embodiment of the present invention, the memory-accessing process without addressing mode in the computer system of the embodiment of the present invention is quite simpler than existing memory schemes of the conventional computer system.

Detailed Structure of Bit-Level Cells

Figure 6:
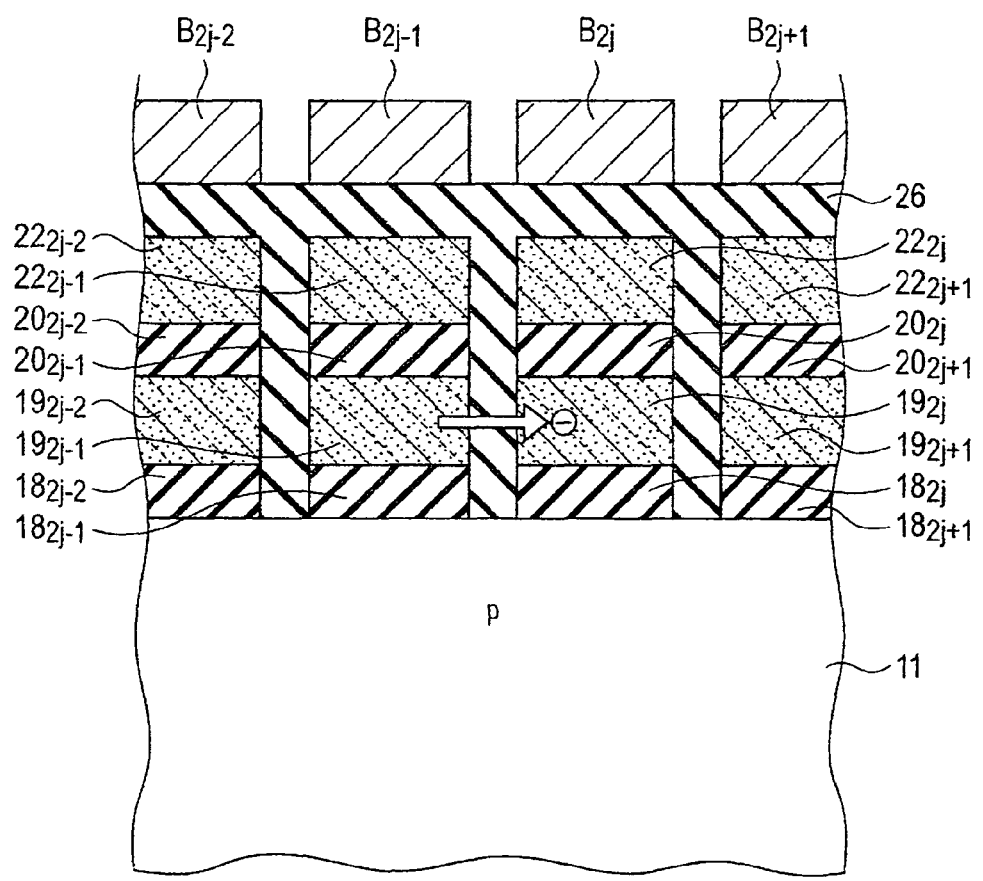
FIG. 6 illustrates a schematic cross-sectional view of the arrays of bit-level cells taken on line VI-VI in the plan view illustrated in FIG. 5.

As illustrated in FIG. 6, each of the bit-level cells, which implement the direct-transfer marching memory of the embodiment of the present invention, encompasses a substrate 11, one of substrate insulators 18$2j$–2, 18$2j$–1, 18$2j$, 18$k(2j+1)$ stacked on the substrate 11, one of floating-gate electrode 19$2j$–2, 19$2j$–1, 19$2j$, 19$k(2j+1)$ stacked on the substrate insulators 18$2j$–2, 18$2j$–1, 18$2j$, 18$k(2j+1)$ configured to accumulate cell-electrons so as to serve as the electron-storage regions, one of inter-electrode dielectrics 20$2j$–2, 20$2j$–1, 20$2j$, 20$k(2j+1)$ stacked on the floating-gate electrodes 19$2j$–2, 19$2j$–1, 19$2j$, 19$k(2j+1)$, and one of control-gate electrodes 22$2j$–2, 22$2j$–1, 22$2j$, 22$k(2j+1)$ stacked on the inter-electrode dielectrics 20$2j$–2, 20$2j$–1, 20$2j$, 20$k(2j+1)$. Portions of an insulator 26 inserted between the floating-gate electrode 19$2j$–2 and the floating-gate electrode 19$2j$–1, between the floating-gate electrode 19$2j$–1 and the floating-gate electrode 19$2j$, between the floating-gate electrode 19$2j$, and the floating-gate electrode 19$2j+1$ serve as an inter-unit dielectric through which cell-electrons can tunnel, respectively. Therefore, a thickness of the inter-unit dielectric is set to be less than five nanometers, for example. Preferably, the thickness of the inter-unit dielectric is set to be less than three nanometers so as to increase the tunneling probability with lower applied voltages. More preferably, the thickness of the inter-unit dielectric is set to be less than two nanometers so as to achieve a higher tunneling probability through the inter-unit dielectric. To each of the control-gate electrodes 22$2j$–2, 22$2j$–1, 22$2j$, 22$k(2j+1)$, one of the triple phase control signals CLOCK1, CLOCK2 and CLOCK3 is applied, respectively, so as to control the potentials of the corresponding floating-gate electrodes 19$2j$–2, 19$2j$–1, 19$2j$, 19$k(2j+1)$ through the inter-electrode dielectrics 20$2j$–2, 20$2j$–1, 20$2j$, 20$k(2j+1)$.

The control-gate electrodes 22$2j$–2, 22$2j$–1, 22$2j$, 22$k(2j+1)$ and the floating-gate electrodes 19$2j$–2, 19$2j$–1, 19$2j$, 19$k(2j+1)$ may be made of impurity-doped polysilicon, refractory metal, or the like, with a thickness of approximately 10 to 200 nm. As the refractory metal, tungsten (W), cobalt (Co), titanium (Ti), or molybdenum (Mo) may be used, or alternatively, silicide films of the refractory metal, such as tungsten silicide (WSi2), cobalt silicide (CoSi2), titanium silicide (TiSi2), molybdenum silicide (MoSi2) film, or polycide films using these silicide films, are also available. A thickness of the substrate insulators 18$2j$–2, 18$2j$–1, 18$2j$, 18$k(2j+1)$ and the inter-electrode dielectrics 20$2j$–2, 20$2j$–1, 20$2j$, 20$k(2j+1)$ may be approximately 50 to 200 nm, although the thickness depends on materials. As material for substrate insulators 18$2j$–2, 18$2j$–1, 18$2j$, 18$k(2j+1)$, inter-electrode dielectrics 20$2j$–2, 20$2j$–1, 20$2j$, 20$k(2j+1)$ and the insulator 26 serving as the inter-unit dielectric, silicon oxide film (SiO2 film) can be used. However, for a miniaturized direct-transfer marching memory with a minimum line width of 100 nm or less in a planar dimension, a material that has a higher relative dielectric constant er than the SiO2 film may be preferable for the inter-electrode dielectrics 20$2j$–2, 20$2j$–1, 20$2j$, 20$k(2j+1)$, considering the coupling capacitance relationship between the floating-gate electrodes 19$2j$–2, 19$2j$–1, 19$2j$, 19$k(2j+1)$ and the control-gate electrode 22$2j$–2, 22$2j$–1, 22$2j$, 22$k(2j+1)$.

Figure 7:
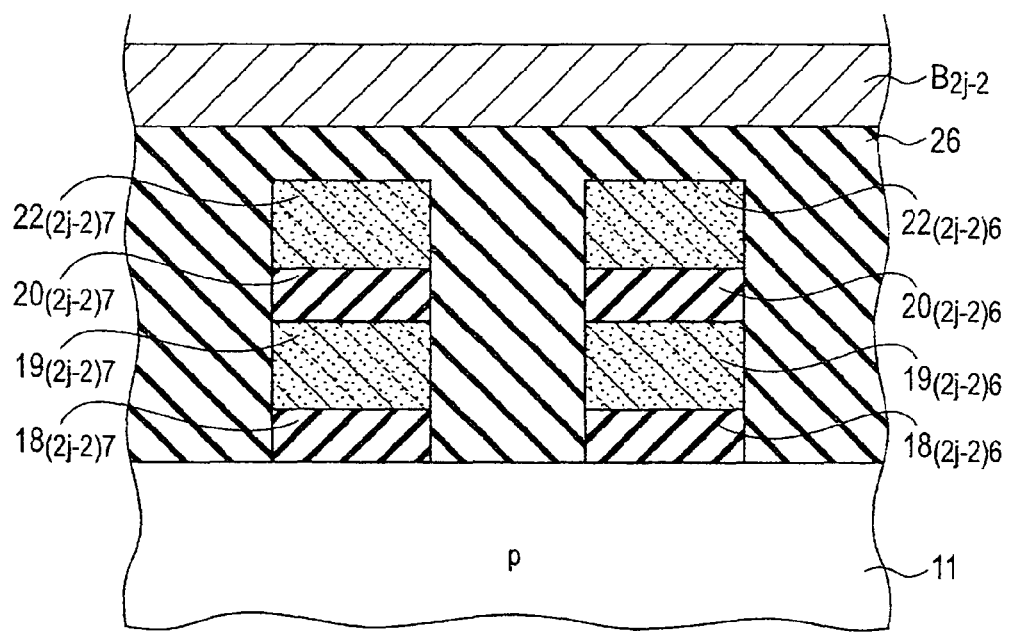
FIG. 7 illustrates a schematic cross-sectional view of the arrays of bit-level cells taken on line VII-VII in the plan view illustrated in FIG. 5.

As illustrated in FIG. 7, each of the bit-level cells in the memory-unit Uk($2j$–2) encompasses a substrate 11, one of substrate insulators 18($2j$–2,)6, 18($2j$–2,)7, . . . stacked on the substrate 11, one of floating-gate electrodes 19($2j$–2,)6, 19($2j$–2,)7, . . . stacked on the substrate insulators 18($2j$–2,)6, 18($2j$–2,)7, . . . serving as the electron-storage regions, one of inter-electrode dielectrics 20($2j$–2,)6, 20($2j$–2,)7 stacked on the floating-gate electrodes 19($2j$–2,)6, 19($2j$–2,)7, and one of control-gate electrodes 22($2j$–2,)6, 22($2j$–2,)7 stacked on the inter-electrode dielectrics 20($2j$–2,)6, 20($2j$–2,)7. A portion of an insulator 26 inserted between the floating-gate electrode 19($2j$–2,)6 and the floating-gate electrode 19($2j$–2,)7 serves as an inter-cell dielectric, which prevents cell-electrons from tunneling. To prevent cell-electrons from tunneling, a thickness of the inter-cell dielectric is set to be larger than 20 nanometers, for example.

Potential Control of Floating-Gate Electrodes

As illustrated in FIG. 1, to each of the control-gate electrodes 22($2j$–2,)6, 22($2j$–2,)7 being aligned sequentially in the memory-unit Uk($2j$–2), the first phase control signal CLOCK1 is applied respectively so as to control simultaneously the potentials of the floating-gate electrodes 19($2j$–2,)6, 19($2j$–2,)7 through the inter-electrode dielectrics 20($2j$–2,)6, 20($2j$–2,)7.

As illustrated in FIG. 1, to each of the control-gate electrodes being aligned sequentially in the memory-unit Uk($2j$–1), one of the control-gate electrodes as represented as the control-gate electrode 22$2j$–1 in FIG. 6 and the second phase control signal CLOCK2 are applied simultaneously through the control line B$2j$–1. Similarly, to each of the control-gate electrodes being aligned sequentially in the memory-unit Uk,$2j$, one of the control-gate electrodes as represented as the control-gate electrode 22$2j$ in FIG. 6 and the third phase control signal CLOCK3 are applied simultaneously through the control line B$2j$. Furthermore, as illustrated on the right side of FIG. 1, to each of the control-gate electrodes being aligned sequentially in the memory-unit next to the memory-unit Uk,$2j$ toward the right end of the array of the memory units, one of the control-gate electrodes as represented as the control-gate electrode 22$j+1$ in FIG. 6 and the first phase control signal CLOCK1 are applied simultaneously through the control line B$2j+1$ to each of the control-gate electrodes being aligned sequentially in the memory-unit, which is the second next to the memory-unit Uk,$2j$ toward the right end of the array of the memory units, the second phase control signal CLOCK2 is applied simultaneously through the control line B$2j+2$ and to each of the control-gate electrodes being aligned sequentially in the memory-unit, which is the third next to the memory-unit Uk,$2j$ toward the right end of the array of the memory units, the third phase control signal CLOCK3 is applied simultaneously through the control line B$2j+3$.

Triple Phase Ternary Clocks

Figure 4:
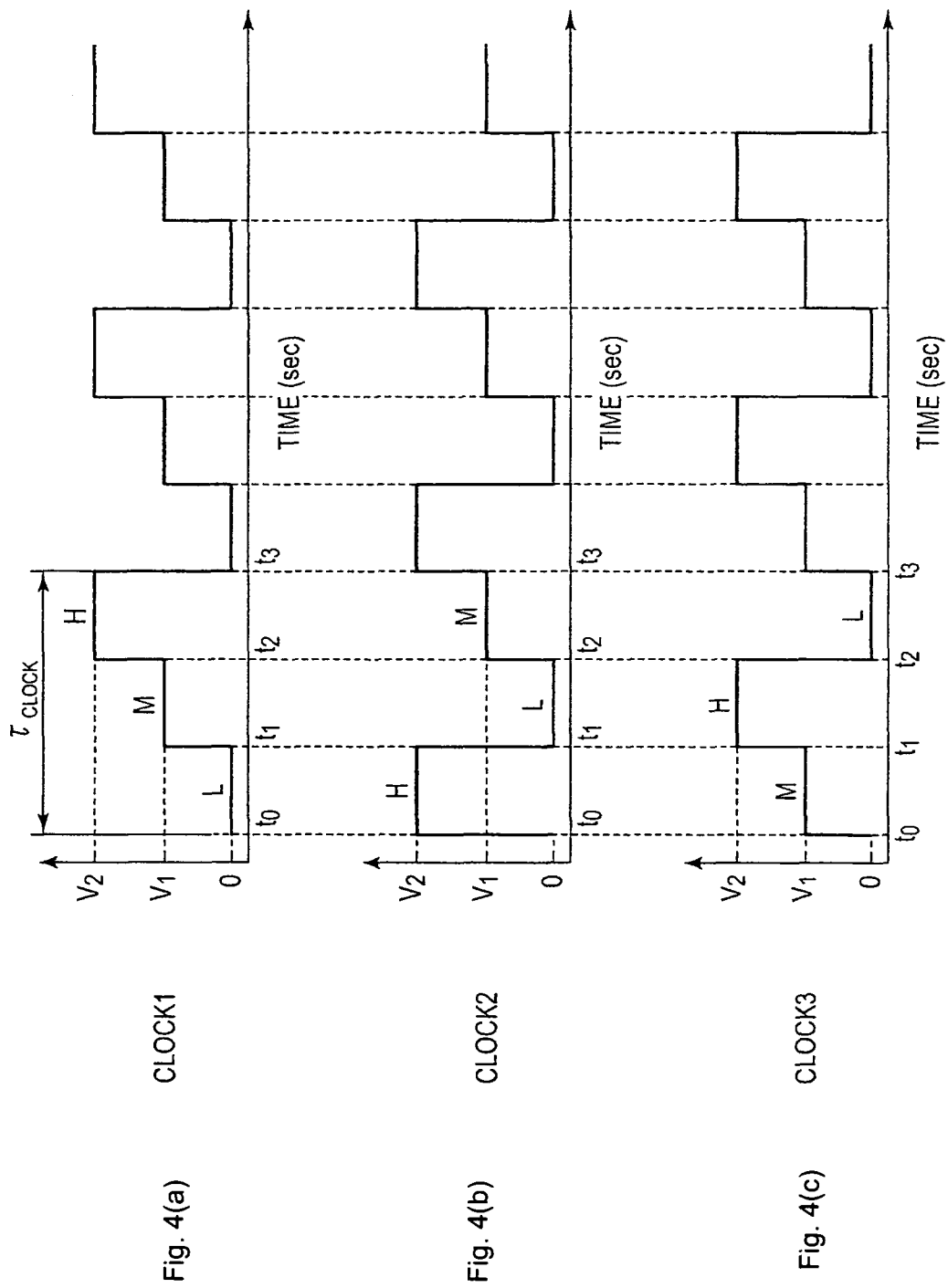
FIG. 4 (a) illustrates a trivalent waveform of a control signal CLOCK1, FIG. 4 (b) illustrates a trivalent waveform of a control signal CLOCK2.

As illustrated in FIGS. 4 (a)-(c), the control signals CLOCK1, CLOCK2 and CLOCK3 are triple phase ternary clocks, respectively, each of which swings between trivalent levels of low (L), medium (M) and high (H) levels at different phases. The potential V2 across the high (H) and low (L) levels is determined so that an electric field large enough to cause quantum tunneling of the cell-electrons through the floating-gate electrode 19$2j$–2 and the floating-gate electrode 19$2j$–1, through the floating-gate electrode 19$2j$–1 and the floating-gate electrode 19$2j$, and through the floating-gate electrode 19$2j$ and the floating-gate electrode 19$2j+1$, respectively is applied. The potential V1 across the medium (M) and low (L) levels is determined to be a half of the potential V2 so that an electric field not to cause quantum tunneling through the floating-gate electrode 19$2j$–2 and the floating-gate electrode 19$2j$–1, through the floating-gate electrode 192*j*−1 and the floating-gate electrode 192*j*, and through the floating-gate electrode 192*j* and the floating-gate electrode 192*j*+1, respectively. However, as far as the potential difference V2−V1, or the potential V1 is not enough to cause the quantum tunneling, the potential V1 is not always required to be the half of the potential V2.

As illustrated in FIG. 4 (*a*), at a time interval between t0 and t1, the first phase control signal CLOCK1 is at the low (L) level, and at time t1 the first phase control signal CLOCK1 rises in a stepwise fashion to the medium (M) level, and keeps the medium (M) level up to the t2, and at time t2 the first phase control signal CLOCK1 further rises in a stepwise fashion to the high (H) level, and keeps the high (H) level up to the t3. At time t3, the first phase control signal CLOCK1 falls in a stepwise fashion to the low (L) level. The time interval between t0 and t3 is defined as a ternary clock period tauclock. Then, as illustrated in FIG. 4(*a*), t1−t0 (=t2−t1=t3−t2) is defined to be one-third of the clock period tauclock (=tauclock /3).

By contrast, as illustrated in FIG. 4 (*b*), at a time interval between t0 and t1, the second phase control signal CLOCK2 is at the high (H) level, and at time t1 the second phase control signal CLOCK2 falls in a stepwise fashion to the low (L) level, and keeps the low (L) level up to the t2, and at time t2 the second phase control signal CLOCK2 rises in a stepwise fashion to the medium (M) level, and keeps the medium (M) level up to the t3. At time t3, the second phase control signal CLOCK2 further rises in a stepwise fashion to the high (H) level. Therefore, the second phase control signal CLOCK2 is delayed from the first phase control signal CLOCK1 by tauclock /3.

Meanwhile, as illustrated in FIG. 4 (*c*), at a time interval between t0 and t1, the third phase control signal CLOCK3 is at the medium (M) level, and at time t1 the third phase control signal CLOCK3 further rises in a stepwise fashion to the high (H) level, and keeps the high (H) level up to the t2, and at time t2 the third phase control signal CLOCK3 falls in a stepwise fashion to the low (L) level, and keeps the low (L) level up to the t3. At time t3, the third phase control signal CLOCK3 rises in a stepwise fashion to the medium (M) level. Therefore, the third phase control signal CLOCK3 is delayed from the second phase control signal CLOCK2 by tauclock /3, and the first phase control signal CLOCK1 is delayed from the third phase control signal CLOCK3 by tauclock /3.

Direct Transfer with Dummy Cell

Figure 8:
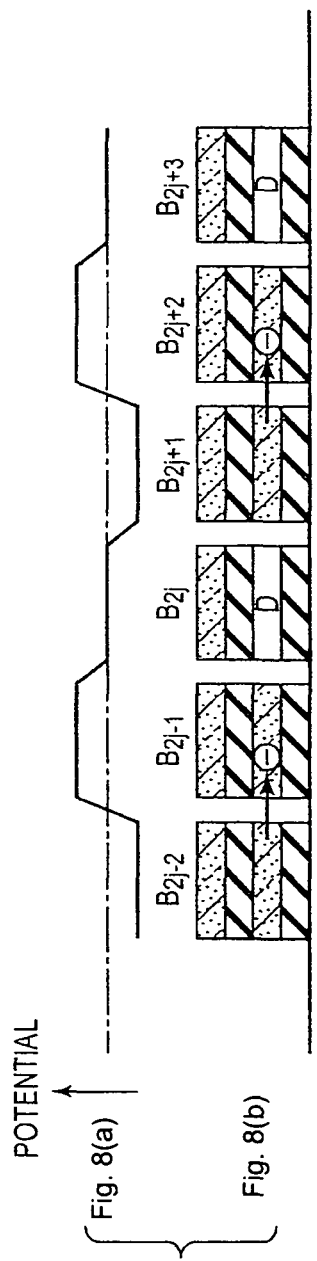
FIG. 8 (a) illustrates a triple phase potential profile of the control electrodes with ternary clock signals at a time interval between t0 and t1, and FIG. 8 (b) illustrates the corresponding quantum tunneling between the adjacent floating-gate electrodes, assigning a single dummy cell in a set of three adjacent floating-gate electrodes, respectively, each of dummy cells proceeds with cell-electrons, in the direct-transfer marching memory pertaining to the embodiment of the present invention.

At a time interval between t0 and t1, which is illustrated in FIG. 4 (*a*)-(*c*), to each of the control-gate electrodes being aligned sequentially in the memory-unit Uk(2*j*−2), one of the control-gate electrodes is represented as the control-gate electrode 222*j*−2 in FIG. 6, the first phase control signal CLOCK1 of the low (L) level is applied, respectively, so as to control simultaneously the potentials of the floating-gate electrodes through the inter-electrode dielectrics as illustrated in FIG. 8(*a*). Meanwhile, at the same time interval of between t0 and t1, to each of the control-gate electrodes being aligned sequentially in the memory-unit Uk(2*j*−1), one of the control-gate electrodes is represented as the control-gate electrode 222*j*−1 in FIG. 6, the second first phase control signal CLOCK1 of the high (H) level is applied simultaneously through the control line B2*j*−1 as illustrated in FIG. 8(*b*). Then, because an electric field, enough to cause quantum tunneling, is applied across the floating-gate electrode 192*j*−2 and the floating-gate electrode 192*j*−1, the cell-electrons tunnel from the floating-gate electrode 192*j*−2 to the floating-gate electrode 192*j*−1 through the inter-unit dielectric 26 inserted between the floating-gate electrode 192*j*−2 and the floating-gate electrode 192*j*−1.

At the same time interval between t0 and t1, to each of the control-gate electrodes being aligned sequentially in the memory-unit Uk,2*j*, one of the control-gate electrodes is represented as the control-gate electrode 222*j* in FIG. 6, because the third phase control signal CLOCK3 of the medium (M) level is applied simultaneously through the control line B2*j*, an electric field enough to cause quantum tunneling is not established across the floating-gate electrode 192*j*−1and the floating-gate electrode 192*j*, any electron cannot tunnel reversely from the floating-gate electrode 192*j* to the floating-gate electrode 192*j*−1, through the inter-unit dielectric 26 inserted between the floating-gate electrode 192*j*−1 and the floating-gate electrode 192*j*, although the cell-electrons in the floating-gate electrode 192*j* have been already extracted to the floating-gate electrode 192*j* by a previous third phase control signal CLOCK3 through tunneling, and the floating-gate electrode 192*j* serves as a dummy cell at the time interval between t0 and t1.

Similarly, at the same time interval of between t0 and t1, as illustrated in FIG. 8(*b*), to each of the control-gate electrodes being aligned sequentially in the memory-unit Uk,2*j*+1, one of the control-gate electrodes is represented as the control-gate electrode 222*j*+1 in FIG. 6, because the first phase control signal CLOCK1 of the low (L) level is applied simultaneously through the control line B2*j*+1, an electric field enough to cause quantum tunneling is not established across the floating-gate electrode 192*j* and the floating-gate electrode 192*j*+1, any electron cannot tunnel reversely from the floating-gate electrode 192*j*+1 to the floating-gate electrode 192*j*, through the inter-unit dielectric 26 inserted between the floating-gate electrode 192*j* and the floating-gate electrode 192*j*+1, wherein the cell-electrons remain in the floating-gate electrode 192*j*+1, which are transferred from the floating-gate electrode 192*j* by the previous third phase control signal CLOCK3 through tunneling.

On the contrary, at the same time interval of between t0 and t1, as illustrated in FIG. 8(*b*), to each of the control-gate electrodes being aligned sequentially in the memory-unit Uk,2*j*+2, the second first phase control signal CLOCK1 of the high (H) level is applied simultaneously through the control line B2*j*+2, because an electric field enough to cause the quantum tunneling of the cell-electrons accumulated in the floating-gate electrode 192*j*+1 is applied across the floating-gate electrode 192*j*+1 and the floating-gate electrode 192*j*+2, the cell-electrons tunnel from the floating-gate electrode 192*j*+1 to the floating-gate electrode 192*j*+2 through the inter-unit dielectric 26 inserted between the floating-gate electrode 192*j*+1 and the floating-gate electrode 192*j*+2. Meanwhile, to each of the control-gate electrodes being aligned sequentially in the memory-unit Uk,2*j*+ 3, because the third phase control signal CLOCK3 of the medium (M) level is applied simultaneously through the control line B2*j*+3, an electric field enough to cause quantum tunneling is not established across the floating-gate electrode 192*j*+2 and the floating-gate electrode 192*j*+3, any electron cannot tunnel reversely from the floating-gate electrode 192*j*+3 to the floating-gate electrode 192*j*+2, through the inter-unit dielectric 26 inserted between the floating-gate electrode 192*j*+2 and the floating-gate electrode 192*j*+3, although the cell-electrons in the floating-gate electrode 192*j*+3 have been already extracted to the next floating-gate electrode by the previous third phase control signal CLOCK3 through tunneling, and the floating-gate electrode 192*j*+3 serves as a dummy cell at the time interval between t0 and t1.

Figure 9:
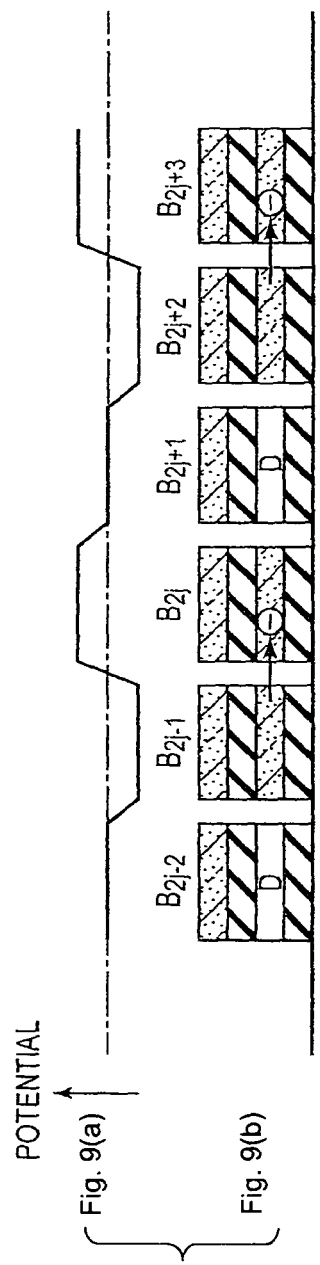
FIG. 9 (a) illustrates a triple phase potential profile of the control electrodes with ternary clock signals at a time interval between t1 and t2, and FIG. 9 (b) illustrates the corresponding quantum tunneling between the adjacent floating-gate electrodes, assigning a single dummy cell in a set of three adjacent floating-gate electrodes, respectively, each of dummy cells proceeds with cell-electrons, in the direct-transfer marching memory pertaining to the embodiment of the present invention.

At the next time interval of between t1 and t2, which are illustrated in FIG. 4 (*a*)-(*c*), to each of the control-gate electrodes being aligned sequentially in the memory-unit Uk(2*j*–2), the first phase control signal CLOCK1 of the medium (M) level is applied, respectively, so as to control simultaneously the potentials of the floating-gate electrodes 192*j*–2 through the inter-electrode dielectrics as illustrated in FIG. 9(*a*). Meanwhile, at the same next time interval between t1 and t2, to each of the control-gate electrodes being aligned sequentially in the memory-unit Uk(2*j*–1), the second phase control signal CLOCK2 of the low (L) level is applied, respectively, so as to control simultaneously the potentials of the floating-gate electrodes 192*j*–1through the inter-electrode dielectrics as illustrated in FIG. 9(*a*). In this situation, because an electric field enough to cause quantum tunneling is not established across the floating-gate electrode 192*j*–2 and the floating-gate electrode 192*j*–1, any electron cannot tunnel reversely from the floating-gate electrode 192*j*–1 to the floating-gate electrode 192*j*, through the inter-unit dielectric 26 inserted between the floating-gate electrode 192*j* and the floating-gate electrode 192*j*–1, although the cell-electrons remain in the floating-gate electrode 192*j*–1, which are transferred from the floating-gate electrode 192*j*–2 at the previous time interval between t0 and t1.

At the same time interval of between t1 and t2, to each of the control-gate electrodes being aligned sequentially in the memory-unit Uk2*j*, the third phase control signal CLOCK3 of the high (H) level is applied simultaneously through the control line B2*j* as illustrated in FIG. 9(*b*). Then, because an electric field enough to cause quantum tunneling is applied across the floating-gate electrode 192*j*–1 and the floating-gate electrode 192*j*, the cell-electrons tunnel from the floating-gate electrode 192*j*–1 to the floating-gate electrode 192*j* through the inter-unit dielectric 26 inserted between the floating-gate electrode 192*j*–1 and the floating-gate electrode 192*j*, since the second phase control signal CLOCK2 of the low (L) level is applied, respectively, so as to control simultaneously the potentials of the floating-gate electrodes 192*j*–1.

At the same time interval of between t1 and t2, to each of the control-gate electrodes being aligned sequentially in the memory-unit Uk,2*j*, because the first phase control signal CLOCK1 of the medium (M) level is applied simultaneously through the control line B2*j*+1, an electric field enough to cause quantum tunneling is not established across the floating-gate electrode 192*j* and the floating-gate electrode 192*j*+1, any electron cannot tunnel reversely from the floating-gate electrode 192*j*+1 to the floating-gate electrode 192*j*, through the inter-unit dielectric 26 inserted between the floating-gate electrode 192*j* and the floating-gate electrode 192*j*+1, although the cell-electrons in the floating-gate electrode 192*j*+1 have been already extracted to the floating-gate electrode 192*j*+1 at the previous time interval between t0 and t1, and the floating-gate electrode 192*j*+1 serves as a dummy cell at the time interval between t1 and t2.

Similarly, at the same time interval of between t1 and t2, as illustrated in FIG. 9(*b*), to each of the control-gate electrodes being aligned sequentially in the memory-unit Uk,2*j*+2, because the second phase control signal CLOCK2 of the low (L) level is applied simultaneously through the control line B2*j*+2, an electric field enough to cause quantum tunneling is not established across the floating-gate electrode 192*j*+1 and the floating-gate electrode 192*j*+2, any electron cannot tunnel reversely from the floating-gate electrode 192*j*+2 to the floating-gate electrode 192*j*+1, through the inter-unit dielectric 26 inserted between the floating-gate electrode 192*j*+1 and the floating-gate electrode 192*j*+2, wherein the cell-electrons remain in the floating-gate electrode 192*j*+2, which are transferred from the floating-gate electrode 192*j*+1 at the previous time interval between t0 and t1.

On the contrary, at the same time interval of between t1 and t2, as illustrated in FIG. 9(*b*), to each of the control-gate electrodes being aligned sequentially in the memory-unit Uk,2*j*+3, the third phase control signal CLOCK3 of the high (H) level is applied simultaneously through the control line B2*j*+3, because an electric field enough to cause the quantum tunneling of the cell-electrons accumulated in the floating-gate electrode 192*j*+2 is applied across the floating-gate electrode 192*j*+2 and the floating-gate electrode 192*j*+3, the cell-electrons tunnel from the floating-gate electrode 192*j*+2 to the floating-gate electrode 192*j*+3 through the inter-unit dielectric 26 inserted between the floating-gate electrode 192*j*+2 and the floating-gate electrode 192*j*+3.

Figure 10:
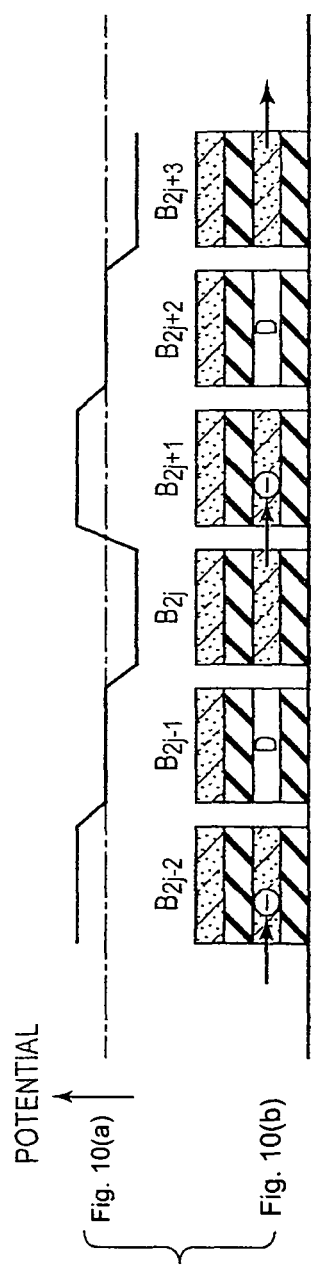
FIG. 10 (a) illustrates a triple phase potential profile of the control electrodes with ternary clock signals at a time interval between t2 and t3, and FIG. 10 (b) illustrates the corresponding quantum tunneling between the adjacent floating-gate electrodes, assigning a single dummy cell in a set of three adjacent floating-gate electrodes, respectively, each of dummy cells proceeds with cell-electrons, in the direct-transfer marching memory pertaining to the embodiment of the present invention.

At the further next time interval of between t2 and t3, which are illustrated in FIG. 4 (*a*)-(*c*), to each of the control-gate electrodes being aligned sequentially in the memory-unit Uk(2*j*–2), the first phase control signal CLOCK1 of the high(H) level is applied, respectively, so as to control simultaneously the potentials of the floating-gate electrodes 192*j*–2 through the inter-electrode dielectrics as illustrated in FIG. 10(*a*). Meanwhile, at the same next time interval between t2 and t3, to each of the control-gate electrodes being aligned sequentially in the memory-unit Uk(2*j*–1), the second phase control signal CLOCK2 of the medium (M) level is applied, respectively, so as to control simultaneously the potentials of the floating-gate electrodes 192*j*–1 through the inter-electrode dielectrics as illustrated in FIG. 10(*a*). In this situation, because an electric field enough to cause quantum tunneling is not established across the floating-gate electrode 192*j*–2 and the floating-gate electrode 192*j*–1, any electron cannot tunnel reversely from the floating-gate electrode 192*j*–1 to the floating-gate electrode 192*j*, through the inter-unit dielectric 26 inserted between the floating-gate electrode 192*j* and the floating-gate electrode 192*j*–1, although the cell-electrons in the floating-gate electrode 192*j*–1 have been already extracted to the floating-gate electrode 192*j* at the previous time interval between t1 and t2, and the floating-gate electrode 192*j*–1 serves as a dummy cell at the time interval between t2 and t3.

Meanwhile, at the same next time interval between t2 and t3, to each of the control-gate electrodes being aligned sequentially in the memory-unit Uk2*j*, the third phase control signal CLOCK3 of the low (L) level is applied, respectively, so as to control simultaneously the potentials of the floating-gate electrodes 192*j* through the inter-electrode dielectrics as illustrated in FIG. 10(*a*). In this situation, because an electric field enough to cause quantum tunneling is not established across the floating-gate electrode 192*j*–2 and the floating-gate electrode 192*j*, any electron cannot tunnel reversely from the floating-gate electrode 192*j* to the floating-gate electrode 192*j*–1, through the inter-unit dielectric 26 inserted between the floating-gate electrode 192*j*–1 and the floating-gate electrode 192*j*, although the cell-electrons remain in the floating-gate electrode 192*j*, which are transferred from the floating-gate electrode 192*j*–1 at the previous time interval between t1 and t2.

At the same time interval of between t2 and t3, to each of the control-gate electrodes being aligned sequentially in the memory-unit Uk($2j$+1), the first phase control signal CLOCK1 of the high (H) level is applied simultaneously through the control line B($2j$+1) as illustrated in FIG. 10(*b*). Then, because an electric field enough to cause quantum tunneling is applied across the floating-gate electrode 19$2j$ and the floating-gate electrode 19($2j$+1), the cell-electrons tunnel from the floating-gate electrode 19$2j$ to the floating-gate electrode 19($2j$+1) through the inter-unit dielectric 26 inserted between the floating-gate electrode 19$2j$ and the floating-gate electrode 19($2j$+1), since the third phase control signal CLOCK3 of the low (L) level is applied, respectively, so as to control simultaneously the potentials of the floating-gate electrodes 19$2j$.

At the same time interval of between t2 and t3, to each of the control-gate electrodes being aligned sequentially in the memory-unit Uk,($2j$+2), because the second phase control signal CLOCK2 of the medium (M) level is applied simultaneously through the control line B($2j$+2), an electric field enough to cause quantum tunneling is not established across the floating-gate electrode 19($2j$+1) and the floating-gate electrode 19($2j$+2), any electron cannot tunnel reversely from the floating-gate electrode 19($2j$+2) to the floating-gate electrode 19($2j$+1), through the inter-unit dielectric 26 inserted between the floating-gate electrode 19($2j$+1) and the floating-gate electrode 19($2j$+2), although the cell-electrons in the floating-gate electrode 19($2j$+2) have been already extracted to the floating-gate electrode 19($2j$+3) at the previous time interval between t1 and t2, and the floating-gate electrode 19($2j$+2) serves as a dummy cell at the time interval between t2 and t3.

Similarly, at the same time interval of between t2 and t3, as illustrated in FIG. 10(*b*), to each of the control-gate electrodes being aligned sequentially in the memory-unit Uk,($2j$+3), because the third phase control signal CLOCK3 of the low (L) level is applied simultaneously through the control line B($2j$+3), an electric field enough to cause quantum tunneling is not established across the floating-gate electrode 19($2j$+2) and the floating-gate electrode 19($2j$+3), any electron cannot tunnel reversely from the floating-gate electrode 19($2j$+3) to the floating-gate electrode 19($2j$+2), through the inter-unit dielectric 26 inserted between the floating-gate electrode 19($2j$+2) and the floating-gate electrode 19($2j$+3), wherein the cell-electrons remain in the floating-gate electrode 19($2j$+3), which are transferred from the floating-gate electrode 19($2j$+2) at the previous time interval between t1 and t2.

Time-and-Space Regime Representation

As illustrated in FIGS. 8-10, in the array of memory units illustrated in FIG. 1, the cell-electrons accumulated in one of the floating-gate electrode in a subject memory unit is directly transferred to an adjacent floating-gate electrode, which is assigned in the next memory unit adjacent to the subject memory unit, the direct transfer of the cell-electrons is established by quantum tunneling of the cell-electrons through an inter-unit dielectric disposed between the one of the floating-gate electrode and the adjacent floating-gate electrode, and the tunneling is controlled by the triple phase ternary control signals CLOCK1, CLOCK2 and CLOCK3.

In the following explanation of the direct transfer of signal charges in the time-and-space regime, although the explicit illustration of floating-gate electrodes 19$k$1, 19$k$2, 19$k$2, ..., 19$k$9 is omitted in the drawings with corresponding reference numerals, the referred to floating-gate electrodes 19$k$1, 19$k$2, 19$k$2, ..., 19$k$9 shall be considered as the floating-gate electrodes assigned in each of memory-unit Uk1, Uk2, Uk2, ..., Uk9, respectively, one dimensional array of the memory-unit Uk1, Uk2, Uk2, ..., Uk9 is illustrated in a lower portion of FIG. 11 as a space-regime representation.

Figure 11:
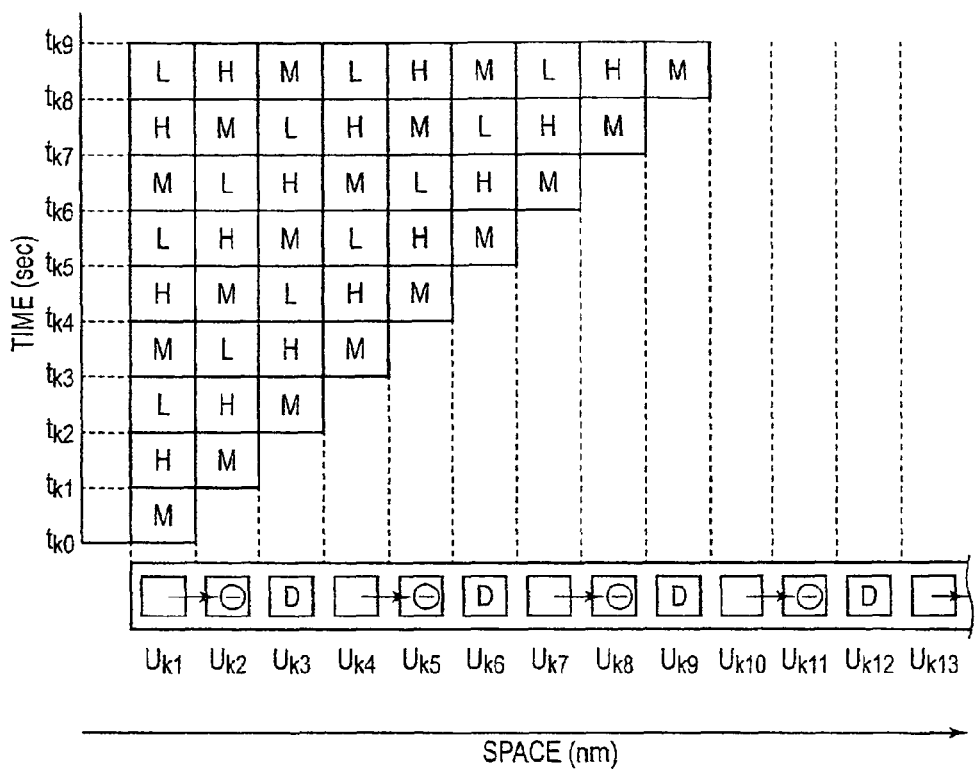
FIG. 11 illustrates a triple phase behavior of the direct transfers of cell-electrons in the time-and-space regime, assigning a plurality of dummy cells in the space regime periodically, each of dummy cells proceeds with cell-electrons, the direct transfers of cell-electrons are illustrated by arrows in the space regime, in the direct-transfer marching memory pertaining to the embodiment of the present invention.

In the space-regime representation of the memory-unit Uk1, Uk2, Uk2, ..., Uk9 illustrated in the lower portion of FIG. 11, a direct transfer of cell-electrons between the memory-unit Uk1 and the memory-unit Uk2 at a time interval between tk2 and tk3, a direct transfer of cell-electrons between the memory-unit Uk4 and the memory-unit Uk5 at a time interval between tk5 and tk6 and a direct transfer of cell-electrons between the memory-unit Uk7 and the memory-unit Uk8 at a time interval between tk8 and tk9, are only illustrated as representative timings and illustration of other direct transfers of cell-electrons at other time intervals are omitted. In the space-regime representation of the memory-unit Uk1, Uk2, Uk2, ..., Uk9, the memory-units Uk3, Uk6, Uk9, and Uk12 are illustrated as the dummy cells Ds at specific timings in which the cell-electrons are depleted, because, the accumulated cell-electrons have been already extracted to the adjacent floating-gate electrode by a previous clock signal through tunneling from the corresponding floating-gate electrode of the dummy cells Ds. The positions of the dummy cells Ds proceed with the marching of the signal charges.

At first, at a time interval between tk0 and tk1 as illustrated in FIG. 11, it is supposed that a clock signal of the medium (M) level is applied simultaneously to each of the control-gate electrodes in the memory-unit Uk1. At a next time interval of between tk1 and tk2 illustrated in FIG. 11, a clock signal of the high (H) level is applied simultaneously to each of the control-gate electrodes in the memory-unit Uk1, and further, an M level signal is applied simultaneously to each of the control-gate electrodes in the memory-unit Uk2. In this situation, an electric field enough to cause quantum tunneling is not established across the floating-gate electrode 19$k$1 and the floating-gate electrode 19$k$2, any electron cannot tunnel reversely from the floating-gate electrode 19$k$2 to the floating-gate electrode 19$k$1, through the inter-unit dielectric 26 inserted between the floating-gate electrode 19$k$1 and the floating-gate electrode 19$k$2, although the cell-electrons in the floating-gate electrode 19$k$2 have been already extracted to the floating-gate electrode 19$k$2 by a previous clock signal through tunneling and the floating-gate electrode 19$k$2 serves as a dummy cell D at the time interval between tk1 and tk2.

At a further next time interval between tk2 and tk3, which is illustrated in FIG. 11, to each of the control-gate electrodes in the memory-unit Uk1, a clock signal of the low (L) level is applied, respectively, so as to control the potentials of the floating-gate electrodes through the inter-electrode dielectrics 26. Meanwhile, at the same time interval of between tk2 and tk3, to each of the control-gate electrodes in the memory-unit Uk2, an H level signal is applied simultaneously. Then, because an electric field enough to cause quantum tunneling is applied across the floating-gate electrode 19$k$1 and the floating-gate electrode 19$k$2, the cell-electrons tunnel from the floating-gate electrode 19$k$1 to the floating-gate electrode 19$k$2 through the inter-unit dielectric 26 inserted between the floating-gate electrode 19$k$1 and the floating-gate electrode 19$k$2. The tunneling-transfer of cell-electrons is represented by an arrow in the space-regime as illustrated in the lower portion of FIG. 11. Then, signal charges march towards the right end of the memory-unit array, and the information of byte size or word size is transferred synchronously with clock signals. At the same time interval of between tk2 and tk3, to each of the control-gate electrodes in the memory-unit Uk3, because an M level signal is applied simultaneously, an electric field enough to cause quantum tunneling is not established across the floating-gate electrode 19k2 and the floating-gate electrode 19k3, any electron cannot tunnel reversely from the floating-gate electrode 19k3 to the floating-gate electrode 19k2, through the inter-unit dielectric 26 inserted between the floating-gate electrode 19k2 and the floating-gate electrode 19k3, although the cell-electrons in the floating-gate electrode 19k3 have been already extracted to the floating-gate electrode 19k3 by a previous clock signal through tunneling, and the floating-gate electrode 19k3 serves as a dummy cell D at the time interval between tk2 and tk3.

At a still further next time interval of between tk3 and tk4, which is illustrated in FIG. 11, to each of the control-gate electrodes in the memory-unit Uk1, an M level signal is applied, respectively, so as to control the potentials of the floating-gate electrodes 19k1 through the inter-electrode dielectrics. Meanwhile, at the same next time interval between tk3 and tk4, to each of the control-gate electrodes in the memory-unit Uk2, an L level signal is applied, respectively, so as to control the potentials of the floating-gate electrodes 19k2 through the inter-electrode dielectrics. Because an electric field enough to cause quantum tunneling is not established across the floating-gate electrode 19k1 and the floating-gate electrode 19k2, any electron cannot tunnel reversely from the floating-gate electrode 19k2 to the floating-gate electrode 19k3, through the inter-unit dielectric 26 inserted between the floating-gate electrode 19k3 and the floating-gate electrode 19k2, although the cell-electrons remain in the floating-gate electrode 19k2, which are transferred from the floating-gate electrode 19k1 at the previous time interval between tk2 and tk3. Furthermore, at the same time interval of between tk3 and tk4, to each of the control-gate electrodes in the memory-unit Uk3, an H level signal is applied simultaneously. Then, because an electric field enough to cause quantum tunneling is applied across the floating-gate electrode 19k2 and the floating-gate electrode 19k3, the cell-electrons tunnel from the floating-gate electrode 19k2 to the floating-gate electrode 19k3 through the inter-unit dielectric 26 inserted between the floating-gate electrode 19k2 and the floating-gate electrode 19k3, since the clock signal of L level is applied, respectively, so as to control the potentials of the floating-gate electrodes 19k2. Then, signal charges march towards the right end of the memory-unit array, and the information of byte size or word size is transferred synchronously with clock signals. Meanwhile, at the same time interval of between tk3 and tk4, to each of the control-gate electrodes in the memory-unit Uk4, because an M level signal is applied simultaneously, an electric field enough to cause quantum tunneling is not established across the floating-gate electrode 19k3 and the floating-gate electrode 19k4, any electron cannot tunnel reversely from the floating-gate electrode 19k4 to the floating-gate electrode 19k3, through the inter-unit dielectric 26 inserted between the floating-gate electrode 19k3 and the floating-gate electrode 19k4, although the cell-electrons in the floating-gate electrode 19k4 have been already extracted to the floating-gate electrode 19k4 at the previous time interval between tk2 and tk3, and the floating-gate electrode 19k4 serves as a dummy cell D at the time interval between t1 and t2.

At a still further next time interval of between tk4 and tk5, which is illustrated in FIG. 11, to each of the control-gate electrodes in the memory-unit Uk1, an H level signal is applied, respectively, so as to control the potentials of the floating-gate electrodes 19k1. Meanwhile, at the same next time interval between tk4 and tk5, to each of the control-gate electrodes in the memory-unit Uk2, an M level signal is applied respectively so as to control the potentials of the floating-gate electrodes 19k2. Because an electric field enough to cause quantum tunneling is not established across the floating-gate electrode 19k1 and the floating-gate electrode 19k2, any electron cannot tunnel reversely from the floating-gate electrode 19k2 to the floating-gate electrode 19k3, although the cell-electrons in the floating-gate electrode 19k2 have been already extracted to the floating-gate electrode 19k3 at the previous time interval between t1 and tk4, and the floating-gate electrode 19k2 serves as a dummy cell D at the time interval between tk4 and tk5. Meanwhile, at the same next time interval between tk4 and tk5, to each of the control-gate electrodes in the memory-unit Uk3, an L level signal is applied, respectively, so as to control the potentials of the floating-gate electrodes 19k3. Because an electric field enough to cause quantum tunneling is not established across the floating-gate electrode 19k2 and the floating-gate electrode 19k3, any electron cannot tunnel reversely from the floating-gate electrode 19k3 to the floating-gate electrode 19k2, although the cell-electrons remain in the floating-gate electrode 19k3, which are transferred from the floating-gate electrode 19k2 at the previous time interval between t1 and tk4. Furthermore, at the same time interval of between tk4 and tk5, to each of the control-gate electrodes in the memory-unit Ukk4, an H level signal is applied simultaneously. Then, because an electric field enough to cause quantum tunneling is applied across the floating-gate electrode 19k3 and the floating-gate electrode 19k4, the cell-electrons tunnel from the floating-gate electrode 19k3 to the floating-gate electrode 19k4, since the clock signal of L level is applied, respectively, so as to control the potentials of the floating-gate electrodes 19k3. Then, signal charges march towards the right end of the memory-unit array and the information of byte size or word size is transferred synchronously with clock signals. Furthermore, at the same time interval of between tk4 and tk5, to each of the control-gate electrodes in the memory-unit Uk5, because an M level signal is applied simultaneously, an electric field enough to cause quantum tunneling is not established across the floating-gate electrode 19k4 and the floating-gate electrode 19k5, any electron cannot tunnel reversely from the floating-gate electrode 19k5 to the floating-gate electrode 19k4, although the cell-electrons in the floating-gate electrode 19k5 have been already extracted to the floating-gate electrode 19k6 at the previous time interval between t3 and tk4, and the floating-gate electrode 19k5 serves as a dummy cell D at the time interval between tk4 and tk5.

At a still further next time interval between tk5 and tk6 illustrated in FIG. 11, to control-gate electrodes in the memory-unit Uk1, an L level signal is applied so as to control the potentials of the floating-gate electrodes. Meanwhile, at the time interval between tk5 and tk6, to control-gate electrodes in the memory-unit Uk2, an H level signal is applied. Then, because an electric field enough to cause quantum tunneling is applied across the floating-gate electrode 19k1 and the floating-gate electrode 19k2, the cell-electrons tunnel from the floating-gate electrode 19k1 to the floating-gate electrode 19k2. A left-side arrow in the lower portion of FIG. 11 represents the tunneling-transfer of cell-electrons. At the time interval between tk2 and tk6, to control-gate electrodes in the memory-unit Uk3, because an M level signal is applied, an electric field enough to cause quantum tunneling is not established across the floating-gate electrode 19k2 and the floating-gate electrode 19k3, any electron cannot tunnel reversely from the floating-gate electrode 19k3 to the floating-gate electrode 19k2, although the cell-electrons in the floating-gate electrode 19k3 have been already extracted to the floating-gate electrode 19k3 by a previous clock signal through tunneling, and the floating-gate electrode 19k3 serves as a dummy cell D at the time interval between tk5 and tk6.

Meanwhile, at the time interval between tk5 and tk6, to control-gate electrodes in the memory-unit Uk4, an L level signal is applied so as to control the potentials of the floating-gate electrodes 19k4. Because an electric field enough to cause quantum tunneling is not established across the floating-gate electrode 19k3 and the floating-gate electrode 19k4, any electron cannot tunnel reversely from the floating-gate electrode 19k4 to the floating-gate electrode 19k3, although the cell-electrons remain in the floating-gate electrode 19k4, which are transferred from the floating-gate electrode 19k3 at the previous time interval between tk4 and tk5. Furthermore, at the time interval between tk5 and tk6, to control-gate electrodes in the memory-unit Uk5, an H level signal is applied. Then, because an electric field enough to cause quantum tunneling is applied across the floating-gate electrode 19k4 and the floating-gate electrode 19k5, the cell-electrons tunnel from the floating-gate electrode 19k4 to the floating-gate electrode 19k5, since the clock signal of L level is applied so as to control the potentials of the floating-gate electrodes 19k4. A right-side arrow in the lower portion of FIG. 11 represents the tunneling-transfer of cell-electrons. Then, signal charges march towards the right end of the memory-unit array, and the information of byte size or word size is transferred synchronously with clock signals. Furthermore, at the time interval between tk5 and tk6, to control-gate electrodes in the memory-unit Uk6, because an M level signal is applied, an electric field enough to cause quantum tunneling is not established across the floating-gate electrode 19k5 and the floating-gate electrode 19k6, any electron cannot tunnel reversely from the floating-gate electrode 19k6 to the floating-gate electrode 19k5, although the cell-electrons in the floating-gate electrode 19k6 have been already extracted to the floating-gate electrode 19k6 at the previous time interval between tk4 and tk5, and the floating-gate electrode 19k6 serves as a dummy cell D at the time interval between tk6 and tk6.

At a still further next time interval of between tk6 and tk7, illustrated in FIG. 11, to control-gate electrodes in the memory-unit Uk1, an M level signal is applied so as to control the potentials of the floating-gate electrodes 19k. Meanwhile, at the time interval between tk6 and tk7, to control-gate electrodes in the memory-unit Uk2, an L level signal is applied so as to control the potentials of the floating-gate electrodes 19k2. Because an electric field enough to cause quantum tunneling is not established across the floating-gate electrode 19k1 and the floating-gate electrode 19k2, any electron cannot tunnel reversely from the floating-gate electrode 19k2 to the floating-gate electrode 19k1, although the cell-electrons remain in the floating-gate electrode 19k2, which are transferred from the floating-gate electrode 19k1 at the previous time interval between tk5 and tk6. Furthermore, at the time interval between tk6 and tk7, to control-gate electrodes in the memory-unit Uk3, an H level signal is applied. Then, because an electric field enough to cause quantum tunneling is applied across the floating-gate electrode 19k2 and the floating-gate electrode 19k3, the cell-electrons tunnel from the floating-gate electrode 19k2 to the floating-gate electrode 19k3, since the clock signal of L level is applied so as to control the potentials of the floating-gate electrodes 19k2. Meanwhile, at the time interval between tk6 and tk7, to control-gate electrodes in the memory-unit Uk4, because an M level signal is applied, an electric field enough to cause quantum tunneling is not established across the floating-gate electrode 19k3 and the floating-gate electrode 19k4, any electron cannot tunnel reversely from the floating-gate electrode 19k4 to the floating-gate electrode 19k3, although the cell-electrons in the floating-gate electrode 19k4 have been already extracted to the floating-gate electrode 19k5 at the previous time interval between tk5 and tk6, and the floating-gate electrode 19k4 serves as a dummy cell D at the time interval between t6 and t7.

Meanwhile, at the time interval between tk6 and tk7, to control-gate electrodes in the memory-unit Uk5, an L level signal is applied so as to control the potentials of the floating-gate electrodes 19k5. Because an electric field enough to cause quantum tunneling is not established across the floating-gate electrode 19k4 and the floating-gate electrode 19k5, any electron cannot tunnel reversely from the floating-gate electrode 19k5 to the floating-gate electrode 19k4, although the cell-electrons remain in the floating-gate electrode 19k5, which are transferred from the floating-gate electrode 19k4 at the previous time interval between tk5 and tk6. Furthermore, at the time interval between tk6 and tk7, to control-gate electrodes in the memory-unit Uk6, an H level signal is applied. Then, because an electric field enough to cause quantum tunneling is applied across the floating-gate electrode 19k5 and the floating-gate electrode 19k6, the cell-electrons tunnel from the floating-gate electrode 19k5 to the floating-gate electrode 19k6, since the clock signal of L level is applied so as to control the potentials of the floating-gate electrodes 19k5. Then, signal charges march towards the right end of the memory-unit array, and the information of byte size or word size is transferred synchronously with clock signals. Furthermore, at the time interval between tk6 and tk7, to control-gate electrodes in the memory-unit Uk7, because an M level signal is applied, an electric field enough to cause quantum tunneling is not established across the floating-gate electrode 19k6 and the floating-gate electrode 19k7, any electron cannot tunnel reversely from the floating-gate electrode 19k7 to the floating-gate electrode 19k6, although the cell-electrons in the floating-gate electrode 19k7 have been already extracted at the previous time interval between tk5 and tk6, and the floating-gate electrode 19k7 serves as a dummy cell D at the time interval between tk6 and tk7.

At a still further next time interval of between tk7 and tk8, illustrated in FIG. 11, to control-gate electrodes in the memory-unit Uk1, an H level signal is applied so as to control the potentials of the floating-gate electrodes 19k1. Meanwhile, at the time interval between tk7 and tk8, to control-gate electrodes in the memory-unit Uk2, an M level signal is applied so as to control the potentials of the floating-gate electrodes 19k2. Because an electric field enough to cause quantum tunneling is not established across the floating-gate electrode 19k1 and the floating-gate electrode 19k2, any electron cannot tunnel reversely from the floating-gate electrode 19k2 to the floating-gate electrode 19k3, although the floating-gate electrode 19k2 serves as a dummy cell D at the time interval between tk7 and tk8. Meanwhile, at the time interval between tk7 and tk8, to control-gate electrodes in the memory-unit Uk3, an L level signal is applied so as to control the potentials of the floating-gate electrodes 19k3. Because an electric field enough to cause quantum tunneling is not established across the floating-gate electrode 19k2 and the floating-gate electrode 19k3, any electron cannot tunnel reversely from the floating-gate electrode 19k3 to the floating-gate electrode 19k2. Furthermore, at the time interval between tk7 and tk8, to control-gate electrodes in the memory-unit Uk4, an H level signal is applied. Then, because an electric field enough to cause quantum tunneling is applied across the floating-gate electrode 19k3 and the floating-gate electrode 19k4, the cell-electrons tunnel from the floating-gate electrode 19k3 to the floating-gate electrode 19k4. Furthermore, at the time interval between tk7 and tk8, to control-gate electrodes in the memory-unit Uk5, because an M level signal is applied, an electric field enough to cause quantum tunneling is not established across the floating-gate electrode 19k4 and the floating-gate electrode 19k5, any electron cannot tunnel reversely from the floating-gate electrode 19k5 to the floating-gate electrode 19k4, although the floating-gate electrode 19k5 serves as a dummy cell D at the time interval between tk7 and tk8.

Meanwhile, at the time interval between tk7 and tk8, to control-gate electrodes in the memory-unit Uk6, an L level signal is applied so as to control the potentials of the floating-gate electrodes 19k6. Because an electric field enough to cause quantum tunneling is not established across the floating-gate electrode 19k5 and the floating-gate electrode 19k6, any electron cannot tunnel reversely from the floating-gate electrode 19k6 to the floating-gate electrode 19k5. Furthermore, at the time interval between tk7 and tk8, to control-gate electrodes in the memory-unit Uk7, an H level signal is applied. Then, because an electric field enough to cause quantum tunneling is applied across the floating-gate electrode 19k6 and the floating-gate electrode 19k7, the cell-electrons tunnel from the floating-gate electrode 19k6 to the floating-gate electrode 19k7, since the clock signal of L level is applied so as to control the potentials of the floating-gate Electrodes 19k6. Then, signal charges march towards the right end of the memory-unit array, and the information of byte size or word size is transferred synchronously with clock signals. Furthermore, at the time interval between tk7 and tk8, to control-gate electrodes in the memory-unit Uk8, because an M level signal is applied, an electric field enough to cause quantum tunneling is not established across the floating-gate electrode 19k7 and the floating-gate electrode 19k8, any electron cannot tunnel reversely from the floating-gate electrode 19k8 to the floating-gate electrode 19k7, although the floating-gate electrode 19k8 serves as a dummy cell D at the time interval between tk7 and tk8.

At a still further next time interval between tk8 and tk9 illustrated in FIG. 11, to control-gate electrodes in the memory-unit Uk1, an L level signal is applied so as to control the potentials of the floating-gate electrodes. Meanwhile, at the time interval between tk8 and tk9, to control-gate electrodes in the memory-unit Uk2, an H level signal is applied. Then, because an electric field enough to cause quantum tunneling is applied across the floating-gate electrode 19k1 and the floating-gate electrode 19k2, the cell-electrons tunnel from the floating-gate electrode 19k1 to the floating-gate electrode 19k2. A left-side arrow in the lower portion of FIG. 11 represents the tunneling-transfer of cell-electrons. At the time interval between tk2 and tk9, to control-gate electrodes in the memory-unit Uk3, because an M level signal is applied, an electric field enough to cause quantum tunneling is not established across the floating-gate electrode 19k2 and the floating-gate electrode 19k3, any electron cannot tunnel reversely from the floating-gate electrode 19k3 to the floating-gate electrode 19k2, although the floating-gate electrode 19k3 serves as a dummy cell D at the time interval between tk8 and tk9.

Meanwhile, at the time interval between tk8 and tk9, to control-gate electrodes in the memory-unit Uk4, an L level signal is applied so as to control the potentials of the floating-gate electrodes 19k4. Because an electric field enough to cause quantum tunneling is not established across the floating-gate electrode 19k3 and the floating-gate electrode 19k4, any electron cannot tunnel reversely from the floating-gate electrode 19k4 to the floating-gate electrode 19k3. Furthermore, at the time interval between tk8 and tk9, to control-gate electrodes in the memory-unit Uk5, an H level signal is applied. Then, because an electric field enough to cause quantum tunneling is applied across the floating-gate electrode 19k4 and the floating-gate electrode 19k5, the cell-electrons tunnel from the floating-gate electrode 19k4 to the floating-gate electrode 19k5, since the clock signal of an L level is applied so as to control the potentials of the floating-gate electrodes 19k4. A central arrow in the lower portion of FIG. 11 represents the tunneling-transfer of cell-electrons. Furthermore, at the time interval between tk8 and tk9, to control-gate electrodes in the memory-unit Uk6, because an M level signal is applied, an electric field enough to cause quantum tunneling is not established across the floating-gate electrode 19k5 and the floating-gate electrode 19k6, any electron cannot tunnel reversely from the floating-gate electrode 19k6 to the floating-gate electrode 19k5, although the floating-gate electrode 19k6 serves as a dummy cell D at the time interval between tk8 and tk9.

Meanwhile, at the time interval between tk8 and tk9, to control-gate electrodes in the memory-unit Uk7, an L level signal is applied so as to control the potentials of the floating-gate electrodes 19k7. Because an electric field enough to cause quantum tunneling is not established across the floating-gate electrode 19k6 and the floating-gate electrode 19k7, any electron cannot tunnel reversely from the floating-gate electrode 19k7 to the floating-gate electrode 19k6. Furthermore, at the time interval between tk8 and tk9, to control-gate electrodes in the memory-unit Uk8, an H level signal is applied. Then, because an electric field enough to cause quantum tunneling is applied across the floating-gate electrode 19k7 and the floating-gate electrode 19k8, the cell-electrons tunnel from the floating-gate electrode 19k7 to the floating-gate electrode 19k8, since the clock signal of L level is applied so as to control the potentials of the floating-gate electrodes 19k7. A right-side arrow in the lower portion of FIG. 11 represents the tunneling-transfer of cell-electrons. Then, signal charges march towards the right end of the memory-unit array, and the information of byte size or word size is transferred synchronously with clock signals. Furthermore, at the time interval between tk8 and tk9, to control-gate electrodes in the memory-unit Uk9, because an M level signal is applied, an electric field enough to cause quantum tunneling is not established across the floating-gate electrode 19k8 and the floating-gate electrode 19k9, any electron cannot tunnel reversely from the floating-gate electrode 19k9 to the floating-gate electrode 19k8, although the floating-gate electrode 19k9 serves as a dummy cell D at the time interval between tk8 and tk9.

Direct Transfer with Triple Phase Binary Clocks in an Ideal Case

In FIGS. 8-11, triple phase ternary clocks, which swing between trivalent levels of low (L), medium (M) and high (H) levels, are employed for preventing reverse transfer of cell-electrons from the preceding memory unit along the marching direction. However, in a scheme employing an ideal dummy cell, in which the cell-electrons are completely depleted such that the accumulated cell-electrons in a floating-gate electrode assigned in the preceding memory unit have been already extracted completely to an adjacent floating-gate electrode in the further preceding memory unit by a previous clock signal, triple phase binary clocks as illustrated in FIGS. 15 (*a*)-(*c*) can be used, even if an electric field enough to cause quantum tunneling is established across the subject floating-gate electrode and the preceding floating-gate electrode, because there are no cell-electrons that can tunnel reversely from the preceding floating-gate electrode to the subject floating-gate electrode.

Figures 15A, 15B, 15C:
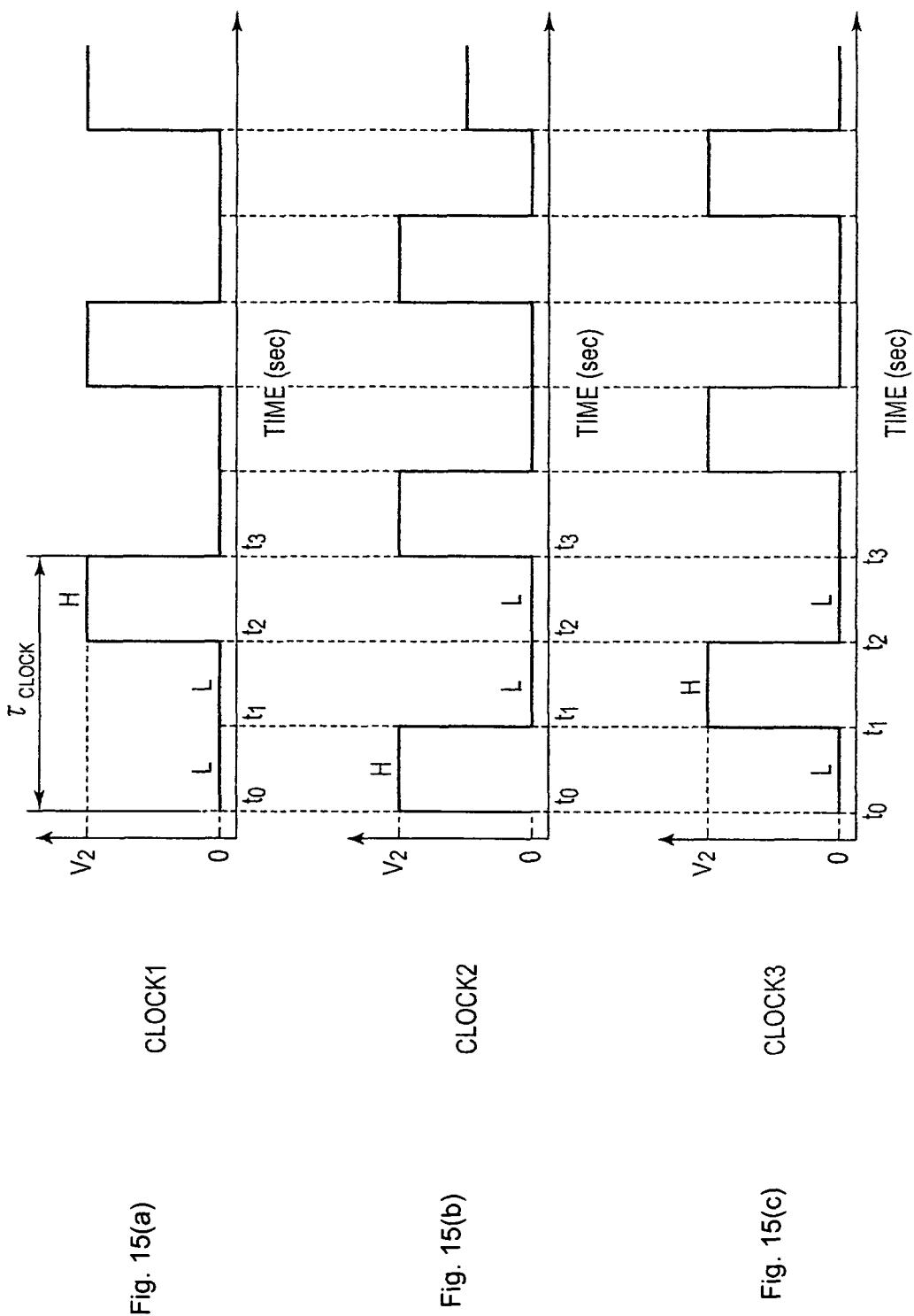
FIG. 15(c) illustrates a binary waveforms of a control signal CLOCK3, each of which swings between binary levels of low (L) and high (H) levels at different phases, respectively, and illustrate that the three control signals CLOCK1, CLOCK2 and CLOCK3 implement triple phase binary clocks.

In FIGS. 15 (*a*)-(*c*), the potential V2 across the high (H) and low (L) levels is determined so that an electric field large enough to cause quantum tunneling of the cell-electrons through the floating-gate electrode 192*j*−2 and the floating-gate electrode 192*j*−1, through the floating-gate electrode 192*j*−1 and the floating-gate electrode 192*j*, and through the floating-gate electrode 192*j* and the floating-gate electrode 192*j*+1, respectively, in the configuration illustrated in FIG. 6.

As illustrated in FIG. 15 (*a*), at a time interval between t0 and t2, the first phase control signal CLOCK1 is at L level, and at time t2 the first phase control signal CLOCK1 rises in a stepwise fashion to the high (H) level, and keeps at the H level up to the t3. At time t3, the first phase control signal CLOCK1 falls in a stepwise fashion to the L level. The time interval between t0 and t3 is defined as a clock period tauclock. Then, in FIG. 4(*a*), t1−t0 (=t2−t1=t3−t2) is defined to be one-third of the clock period tauclock (=tauclock /3).

By contrast, as illustrated in FIG. 15 (*b*), at a time interval between t0 and t1, the second phase control signal CLOCK2 is at the H level, and at time t1 the second phase control signal CLOCK2 falls in a stepwise fashion to the L level, and keeps at the L level up to the t3, and at time t3, the second phase control signal CLOCK2 rises in a stepwise fashion to the H level. Meanwhile, as illustrated in FIG. 15 (*c*), at a time interval between t0 and t1, the third phase control signal CLOCK3 is at the L level, and at time t1 the third phase control signal CLOCK3 rises in a stepwise fashion to the H level, and keeps at the H level up to the t2, and at time t2 the third phase control signal CLOCK3 falls in a stepwise fashion to the L level, and keeps at L level up to the t3.

At a time interval between t0 and t1, which is illustrated in FIG. 15 (*a*)-(*c*), to each of the control-gate electrodes in the memory-unit Uk(2*j*−2), the first phase control signal CLOCK1 of L level is applied, respectively, so as to control simultaneously the potentials of the floating-gate electrodes through the inter-electrode dielectrics as illustrated in FIG. 12(*a*). Meanwhile, at the same time interval of between t0 and t1, to each of the control-gate electrodes in the memory-unit Uk(2*j*−1), the second first phase control signal CLOCK1 of H level is applied simultaneously through the control line B2*j*−1 as illustrated in FIG. 12(*b*). Then, because an electric field enough to cause quantum tunneling is applied across the floating-gate electrode 192*j*−2 and the floating-gate electrode 192*j*−1, the cell-electrons tunnel from the floating-gate electrode 192*j*−2 to the floating-gate electrode 192*j*−1.

At the same time interval of between t0 and t1, to each of the control-gate electrodes in the memory-unit Uk,2*j*, because the third phase control signal CLOCK3 of L level is applied simultaneously through the control line B2*j*, although an electric field enough to cause quantum tunneling is established across the floating-gate electrode 192*j*−1 and the floating-gate electrode 192*j*, any electron cannot tunnel reversely from the floating-gate electrode 192*j* to the floating-gate electrode 192*j*−1, because the cell-electrons in the floating-gate electrode 192*j* have been already extracted completely to the floating-gate electrode 192*j* by a previous third phase control signal CLOCK3 through tunneling, and the floating-gate electrode 192*j* serves as an ideal dummy cell at the time interval between t0 and t1.

Similarly, at the same time interval of between t0 and t1, as illustrated in FIG. 12(*b*), to each of the control-gate electrodes in the memory-unit Uk,2*j*+1, because the first phase control signal CLOCK1 of L level is applied simultaneously through the control line B2*j*+1, an electric field enough to cause quantum tunneling is not established across the floating-gate electrode 192*j* and the floating-gate electrode 192*j*+1, any electron cannot tunnel reversely from the floating-gate electrode 192*j*+1 to the floating-gate electrode 192*j*, wherein cell-electrons absolutely remain in the floating-gate electrode 192*j*+1, which are transferred completely from the floating-gate electrode 192*j* by the previous third phase control signal CLOCK3 through tunneling.

On the contrary, at the same time interval of between t0 and t1, as illustrated in FIG. 12(*b*), to each of the control-gate electrodes in the memory-unit Uk,2*j*+2, the second first phase control signal CLOCK1 of H level is applied simultaneously through the control line B2*j*+2, because an electric field enough to cause the quantum tunneling of the cell-electrons accumulated in the floating-gate electrode 192*j*+1 is applied across the floating-gate electrode 192*j*+1 and the floating-gate electrode 192*j*+2, the cell-electrons tunnel from the floating-gate electrode 192*j*+1 to the floating-gate electrode 192*j*+2. Meanwhile, to each of the control-gate electrodes in the memory-unit Uk,2*j*+3, because the third phase control signal CLOCK3 of L level is applied simultaneously through the control line B2*j*+3, although an electric field enough to cause quantum tunneling is established across the floating-gate electrode 192*j*+2 and the floating-gate electrode 192*j*+3, any electron cannot tunnel reversely from the floating-gate electrode 192*j*+3 to the floating-gate electrode 192*j*+2, because the cell-electrons in the floating-gate electrode 192*j*+3 have been already extracted completely to the next floating-gate electrode by the previous third phase control signal CLOCK3 through tunneling, and the floating-gate electrode 192*j*+3 serves as an ideal dummy cell at the time interval between t0 and t1.

At the next time interval of between t1 and t2, which is illustrated in FIG. 15 (*a*)-(*c*), to each of the control-gate electrodes in the memory-unit Uk(2*j*−2), the first phase control signal CLOCK1 of L level is applied, respectively, so as to control simultaneously the potentials of the floating-gate electrodes 192*j*−2 through the inter-electrode dielectrics as illustrated in FIG. 13(*a*). Meanwhile, at the same next time interval between t1 and t2, to each of the control-gate electrodes in the memory-unit Uk(2*j*−1), the second phase control signal CLOCK2 of L level is applied, respectively, so as to control simultaneously the potentials of the floating-gate electrodes 192*j*−1 through the inter-electrode dielectrics as illustrated in FIG. 13(*a*). In this situation, because an electric field enough to cause quantum tunneling is not established across the floating-gate electrode 192*j*−2 and the floating-gate electrode 192*j*−1, any electron cannot tunnel reversely from the floating-gate electrode 192*j*−1 to the floating-gate electrode 192*j*, although the cell-electrons absolutely remain in the floating-gate electrode 192*j*−1, which are transferred completely from the floating-gate electrode 192*j*−2 at the previous time interval between t0 and t1.

At the same time interval of between t1 and t2, to each of the control-gate electrodes in the memory-unit Uk2*j*, the third phase control signal CLOCK3 of H level is applied simultaneously through the control line B2$j$ as illustrated in FIG. 13($b$). Then, because an electric field enough to cause quantum tunneling is applied across the floating-gate electrode 192$j$−1 and the floating-gate electrode 192$j$, the cell-electrons tunnel from the floating-gate electrode 192$j$−1to the floating-gate electrode 192$j$ since the second phase control signal CLOCK2 of L level is applied respectively so as to control simultaneously the potentials of the floating-gate electrodes 192$j$−1.

At the same time interval of between t1 and t2, to each of the control-gate electrodes in the memory-unit Uk,2$j$, because the first phase control signal CLOCK1 of L level is applied simultaneously through the control line B2$j$+1, although an electric field enough to cause quantum tunneling is established across the floating-gate electrode 192$j$ and the floating-gate electrode 192$j$+1, any electron cannot tunnel reversely from the floating-gate electrode 192$j$+1 to the floating-gate electrode 192$j$, because the cell-electrons in the floating-gate electrode 192$j$+1 have been already extracted completely to the floating-gate electrode 192$j$+1 at the previous time interval between t0 and t1, and the floating-gate electrode 192$j$+1 serves as an ideal dummy cell at the time interval between t1 and t2.

Similarly, at the same time interval of between t1 and t2, as illustrated in FIG. 13($b$), to each of the control-gate electrodes in the memory-unit Uk,2$j$+2because the second phase control signal CLOCK2 of L level is applied simultaneously through the control line B2$j$+2, an electric field enough to cause quantum tunneling is not established across the floating-gate electrode 192$j$+1 and the floating-gate electrode 192$j$+2, any electron cannot tunnel reversely from the floating-gate electrode 192$j$+2 to the floating-gate electrode 192$j$+1, wherein cell-electrons absolutely remain in the floating-gate electrode 192$j$+2, which are transferred completely from the floating-gate electrode 192$j$+1 at the previous time interval between t0 and t1.

On the contrary, at the same time interval of between t1 and t2, as illustrated in FIG. 13($b$), to each of the control-gate electrodes in the memory-unit Uk,2$j$+3, the third phase control signal CLOCK3 of H level is applied simultaneously through the control line B2$j$+3, because an electric field enough to cause the quantum tunneling of the cell-electrons accumulated in the floating-gate electrode 192$j$+2 is applied across the floating-gate electrode 192$j$+2 and the floating-gate electrode 192$j$+3, the cell-electrons tunnel from the floating-gate electrode 192$j$+2 to the floating-gate electrode 192$j$+3.

At the further next time interval of between t2 and t3, which is illustrated in FIG. 15 ($a$)-($c$), to each of the control-gate electrodes in the memory-unit Uk(2$j$−2), the first phase control signal CLOCK1 of the high(H) level is applied respectively so as to control simultaneously the potentials of the floating-gate electrodes 192$j$−2 through the inter-electrode dielectrics as illustrated in FIG. 14($a$). Meanwhile, at the same next time interval between t2 and t3, to each of the control-gate electrodes in the memory-unit Uk(2$j$−1), the second phase control signal CLOCK2 of L level is applied, respectively, so as to control simultaneously the potentials of the floating-gate electrodes 192$j$−1 through the inter-electrode dielectrics as illustrated in FIG. 14($a$). In this situation, although an electric field enough to cause quantum tunneling is established across the floating-gate electrode 192$j$−2 and the floating-gate electrode 192$j$−1, any electron cannot tunnel reversely from the floating-gate electrode 192$j$−1 to the floating-gate electrode 192$j$, because the cell-electrons in the floating-gate electrode 192$j$−1 have been already extracted completely to the floating-gate electrode 192$j$ at the previous time interval between t1 and t2, and the floating-gate electrode 192$j$−1 serve as an ideal dummy cell at the time interval between t2 and t3.

Meanwhile, at the same next time interval between t2 and t3, to each of the control-gate electrodes in the memory-unit Uk2$j$, the third phase control signal CLOCK3 of L level is applied, respectively, so as to control simultaneously the potentials of the floating-gate electrodes 192$j$ through the inter-electrode dielectrics as illustrated in FIG. 14($a$). In this situation, because an electric field enough to cause quantum tunneling is not established across the floating-gate electrode 192$j$−2 and the floating-gate electrode 192$j$, any electron cannot tunnel reversely from the floating-gate electrode 192$j$ to the floating-gate electrode 192$j$−1, although the cell-electrons absolutely remain in the floating-gate electrode 192$j$, which are transferred completely from the floating-gate electrode 192$j$−1 at the previous time interval between t1 and t2.

At the same time interval of between t2 and t3, to each of the control-gate electrodes in the memory-unit Uk(2$j$+1), the first phase control signal CLOCK1 of H level is applied simultaneously through the control line B(2$j$+1) as illustrated in FIG. 14($b$). Then, because an electric field enough to cause quantum tunneling is applied across the floating-gate electrode 192$j$ and the floating-gate electrode 19(2$j$+1), the cell-electrons tunnel from the floating-gate electrode 192$j$ to the floating-gate electrode 19(2$j$+1), since the third phase control signal CLOCK3 of L level is applied, respectively, so as to control simultaneously the potentials of the floating-gate electrodes 192$j$.

At the same time interval of between t2 and t3, to each of the control-gate electrodes in the memory-unit Uk,(2$j$+2), because the second phase control signal CLOCK2 of L level is applied simultaneously through the control line B(2$j$+2), although an electric field enough to cause quantum tunneling is established across the floating-gate electrode 19(2$j$+1) and the floating-gate electrode 19(2$j$+2), any electron cannot tunnel reversely from the floating-gate electrode 19(2$j$+2) to the floating-gate electrode 19(2$j$+1), because the cell-electrons in the floating-gate electrode 19(2$j$+2) have been already extracted completely to the floating-gate electrode 19(2$j$+3) at the previous time interval between t1 and t2, and the floating-gate electrode 19(2$j$+2) serves as an ideal dummy cell at the time interval between t2 and t3.

Similarly, at the same time interval of between t2 and t3, as illustrated in FIG. 14($b$), to each of the control-gate electrodes in the memory-unit Uk,(2$j$+3), because the third phase control signal CLOCK3 of L level is applied simultaneously through the control line B(2$j$+3), an electric field enough to cause quantum tunneling is not established across the floating-gate electrode 19(2$j$+2) and the floating-gate electrode 19(2$j$+3), any electron cannot tunnel reversely from the floating-gate electrode 19(2$j$+3) to the floating-gate electrode 19(2$j$+2), wherein cell-electrons absolutely remain in the floating-gate electrode 19(2$j$+3), which are transferred completely from the floating-gate electrode 19(2$j$+2) at the previous time interval between t1 and t2.

Input/Output-Terminal Columns

In FIG. 3, a topology such that a sequence of input-terminal column I1, . . . , Ik−1, Ik, Ik+1, . . . , Im is arranged at the left end of the array, being disposed at the left side of the memory unit U11, . . . , U(k−1)1, Uk,1, U(k+1)1, . . . , Um1, and a sequence of output-terminal column O1, . . . , Ok−1, Ok, Ok+1, . . . , Om is arranged at the right end of the array, being disposed at the left side of the memory unit Uln, . . . , U(k−1)n, Uk,n, U(k+1)n, . . . , Umn is illustrated as an example. Although many configurations can be used for the circuit topology of the input-terminal column Il, . . . , Ik−1, Ik, Ik+1, . . . , Im and the output-terminal column O1, . . . , Ok−1, Ok, Ok+1, . . . , Om, in FIG. 16, in which k-th row input-terminal column Ik is provided at the left end of the array, being disposed at the left side of the k-th row memory unit Uk1 and k-th row output-terminal column Ok is provided at the right end of the array, examples of the configuration of the input-terminal column Ik and the output-terminal column Ok are illustrated.

In the k-th row input-terminal column Ik, a group of input storage transistors, such as nMOS-FET are adjacently aligned along the column direction (vertical direction). Although all of the gates of the input storage transistors are connected to an input control line and all of the drain regions of the input storage transistors are connected to common ground line, each of the source regions of the input storage transistors are, respectively, connected independently to the corresponding horizontal input terminals Ik0, Ik1, Ik2, . . . . Each of the input storage transistors encompasses the common substrate 11 of the array of memory units (See FIG. 6), a gate insulator stacked on the substrate, a floating-gate electrode stacked on the gate insulator, configured to accumulate input electron-charges, an inter-electrode dielectric stacked on the floating-gate electrode, and a control-gate electrode stacked on the inter-electrode dielectric, configured to be applied with an input-drive signal through the input control line. An array of high impurity concentration regions of n+ type semiconductor is buried at a surface of p-type semiconductor substrate 11 as the source regions and drain regions of the respective input storage transistors. Then, a sequence of isolated channel regions are defined between the respective source regions and the corresponding drain regions, so that each of the channel regions of the input storage transistors is isolated by a device isolation region such as shallow trench isolation (STI), respectively.

The gate structure of the input storage transistors is very similar to the stacked structure of the bit-level cells illustrated in FIG. 6, but the thickness of the gate insulator is thinner than the thickness of the substrate insulator 18 so that hot electrons can tunnel from a channel region defined in the substrate 11 to the corresponding floating-gate electrode of the subject input storage transistor through the gate insulator. For example, if the gate insulator is made of a silicon oxide film (SiO2 film) or the like, the thickness of the gate insulator is set to be approximately one to fifteen nanometers. Because the thickness of the gate insulator is thinner than the thickness of the substrate insulator 18, a top surface of the substrate 11 disposed just under the gate insulator is made higher than the top surface of the substrate 11 disposed just under the substrate insulator 18, so that the vertical level of the floating-gate electrode assigned to the input-terminal column Ik is the same as the vertical level of the floating-gate electrode assigned to the memory unit Uk1.

As input signals are supplied to each of the source regions of the input storage transistors through the horizontal input terminals Ik0, Ik1, Ik2, . . . , Ik31, when a predetermined write-in voltage is applied to each of the control-gate electrodes of the input storage transistors in the input-terminal column Ik, tunneling currents (Fowler-Nordheim currents) flow into the floating-gate electrodes of the corresponding input storage transistors from the channel regions defined in the substrate 11 through the gate insulators and the input charges are accumulated in the floating-gate electrodes of the corresponding input storage transistors, respectively.

In the array of memory units illustrated in FIG. 16, the horizontal data-transfer lines in the array of memory units are defined along each of the directions of the horizontal input terminals Ik0, Ik1, Ik2, . . . , Ik31, and the electron charges as one of input signals, which are accumulated in one of the floating-gate electrodes in the input-terminal column Ik, are transferred to an adjacent floating-gate electrode of the memory unit Uk1, the transfer of the electron charges is established by quantum tunneling of electrons through an inter-unit dielectric 26 disposed between the floating-gate electrode of input-terminal column Ik and the adjacent floating-gate electrode of the memory unit Uk1, the tunneling is controlled by the clock signals applied through the control line B1 as illustrated in FIG. 16.

In the k-th row output-terminal column Ok, similar to the group of input storage transistors, a group of output-terminal transistors, such as nMOS-FET are adjacently aligned along the column direction (vertical direction). Although all of the gates of the output-terminal transistors are connected to an output control line and all of the source regions of the output-terminal transistors are connected to a common bias line, each of the drain regions of the output-terminal transistors are, respectively, connected independently to the corresponding horizontal output terminals Ok0, Ok1, Ok2, . . . , Ok31. Each of the output-terminal transistors encompasses the common substrate 11 of the array of memory units (See FIG. 6), a gate insulator stacked on the substrate, a floating-gate electrode stacked on the gate insulator configured to accumulate output electron-charges, an inter-electrode dielectric stacked on the floating-gate electrode, and a control-gate electrode stacked on the inter-electrode dielectric configured to be applied with an output-drive signal through the output control line. An array of high impurity concentration regions of n+ type semiconductor is buried at a surface of p-type semiconductor substrate 11 as the drain regions and source regions of the respective output-terminal transistors. Then, a sequence of isolated channel regions are defined between the respective drain regions and the corresponding source regions, so that each of the channel regions of the output-terminal transistors is isolated by a device isolation region such as shallow trench isolation (STI), respectively.

Similar to the input storage transistors, the gate structure of the output-terminal transistors is very similar to the stacked structure of the bit-level cells illustrated in FIG. 6, but the thickness of the gate insulator is thinner than the thickness of the substrate insulator 18 so that each of the storage states in the floating-gate electrodes can, respectively, influence the corresponding surface potential of the channel region defined in the substrate 11. For example, if the gate insulator is made of a silicon oxide film (SiO2 film) or the like, the thickness of the gate insulator is set to be approximately one to fifteen nanometers. Because the thickness of the gate insulator is thinner than the thickness of the substrate insulator 18, a top surface of the substrate 11, disposed just under the gate insulator, is made higher than the top surface of the substrate 11 disposed just under the substrate insulator 18, so that the vertical level of the floating-gate electrode assigned to the output-terminal column Ok is the same as the vertical level of the floating-gate electrode assigned to the memory unit Uk1.

In the array of memory units illustrated in FIG. 16, as the horizontal data-transfer lines in the array of memory units are defined along each of the directions of the horizontal output terminals Ok0, Ok1, Ok2, . . . , Ok31, the cell-electrons as one of output signals, which are accumulated in one of the floating-gate electrode of the memory unit Uk1, disposed at the right end of the array of the memory unit, are transferred to the floating-gate electrodes in the output-terminal column Ok. The transfer of the cell-electrons is established by quantum tunneling of the cell-electrons through an inter-unit dielectric 26 disposed between the floating-gate electrode of output-terminal column Ok and the adjacent floating-gate electrode of the right end memory unit.

Then, the output signals can be delivered from each of the drain regions of the output-terminal transistors through the horizontal output terminals Ok0, Ok1, Ok2, . . . , Ok31, when a predetermined read-out voltage is applied to each of the control-gate electrodes of the output-terminal transistors, because each of the current flowing the channel region between the source and drain region in each of the output-terminal transistors is determined by the amount of charges accumulated in the floating-gate electrodes of the corresponding output-terminal transistors, respectively. In this way, the current flow through the channel region of the output-terminal transistors is sensed and forms a binary code. The stored data in the floating-gate electrodes of the output-terminal transistors are reproduced by the output-terminal column Ok.

Another Example of Input-Terminal Column

In the array of memory units illustrated in FIG. 17, the k-th row input-terminal column Ik is provided at the left end of the array, being disposed at the left side of the k-th row memory unit Uk1. A pair of select transistors, which select a group of input storage transistors, which are adjacently aligned in the k-th row input-terminal column Ik, is provided along the column direction at either end of the input-terminal column Ik.

The gate of the input storage transistors are connected to horizontal control terminals Iwk0, Iwk1, Iwk2, . . . , Iwk31 and each of the input storage transistors encompasses the common substrate 11 of the array of memory units (See FIG. 6), a gate insulator stacked on the substrate, a floating-gate electrode stacked on the gate insulator, configured to accumulate input electron-charges, an inter-electrode dielectric stacked on the floating-gate electrode, and a control-gate electrode stacked on the inter-electrode dielectric, configured to be applied with an input-drive signal through one of the horizontal control terminals Iwk0, Iwk1, Iwk2, . . . , Iwk31. An array of n+ type semiconductor regions is buried as source/drain regions of the respective input storage transistors at a surface of p-type semiconductor substrate 11 in a high impurity concentration so as to establish channel regions between the source/drain region. The gate structure of the input storage transistors is very similar to the stacked structure of the bit-level cells illustrated in FIG. 6, but the thickness of the gate insulator is thinner than the thickness of the substrate insulator 18 so that hot electrons can tunnel from the substrate 11 to the floating-gate electrode of the input storage transistors through the gate insulator. For example, if the gate insulator is made of a silicon oxide film ($SiO_2$ film) or the like, the thickness of the gate insulator is set to be approximately one to fifteen nanometers. Because the thickness of the gate insulator is thinner than the thickness of the substrate insulator 18, a top surface of the substrate 11 disposed just under the gate insulator is made higher than the top surface of the substrate 11 disposed just under the substrate insulator 18, so that the vertical level of the floating-gate electrode assigned to the input-terminal column Ik is the same as the vertical level of the floating-gate electrode assigned to the memory unit Uk1.

In the array of memory units illustrated in FIG. 17, the electron charges, as one of input signals which are accumulated in one of the floating-gate electrodes in the input-terminal column Ik, are transferred to an adjacent floating-gate electrode of the memory unit Uk1. The transfer of the electron charges is established by quantum tunneling of the electrons through an inter-unit dielectric 26 disposed between the floating-gate electrode of input-terminal column Ik and the adjacent floating-gate electrode of the memory unit Uk1, the tunneling is controlled by the clock signals applied through the control line B1 as illustrated in FIG. 17.

As illustrated in FIG. 17, a pair of select gate lines SGDk and SGSk is connected to the respective gates of the pair of select transistors. Similar to the NAND flash memory, a page buffer may be connected to an input control line, running in parallel with the memory-unit lines B1, B2, . . . , B2j−2, B2j−1, B2j, B2j+1, . . . , so as to write the input information into the input memory unit Ik. Upper select gate line SGDk illustrated in FIG. 17 is connected to the gate of upper select transistor. Lower select gate line SGSk is connected to the gate of the lower select transistor. The drain electrode of the upper select transistors is connected to the input control line. The source electrode of the upper select transistor is connected to the drain electrode of the uppermost input storage transistor in the input memory unit Ik. The drain electrode of the lower select transistor is connected to the source electrodes of the lowermost input storage transistor in the input memory unit Ik and the source electrode of the lower select transistor is connected to the common source line CSk.

A row decoder/ charge pumping circuit may be connected to the horizontal control terminals Iwk0, Iwk1, Iwk2, . . . , Iwk31 and the potentials applied through horizontal control terminals Iwk0, Iwk1, Iwk2, . . . , Iwk31 control respective electron-storage states of the respective input-transistors implementing the input-terminal column Ik so as to write input signals into each of the floating-gate electrodes in the input-terminal column Ik, respectively. Through the horizontal control terminals Iwk0, Iwk1, Iwk2, . . . , Iwk31, when a predetermined write-in voltage is applied between the substrate 11 and the control-gate electrodes of the input storage transistors in the input-terminal column Ik, tunneling currents (Fowler-Nordheim currents) flow through the gate insulators and the input charges are accumulated in the floating-gate electrodes of the corresponding input storage transistors, respectively. Then, the horizontal data-transfer lines in the array of memory units are defined along each of the directions of the horizontal control terminals Iwk0, Iwk1, Iwk2, . . . , Iwk31.

As to the k-th row output-terminal column Ok, disposed at the right end of the array of the memory unit illustrated in FIG. 17, because the configuration and the operation are essentially the same as the row output-terminal column Ok illustrated in FIG. 16, the duplicated explanation is omitted.

Reverse-Directional Marching Memory

Figure 18:
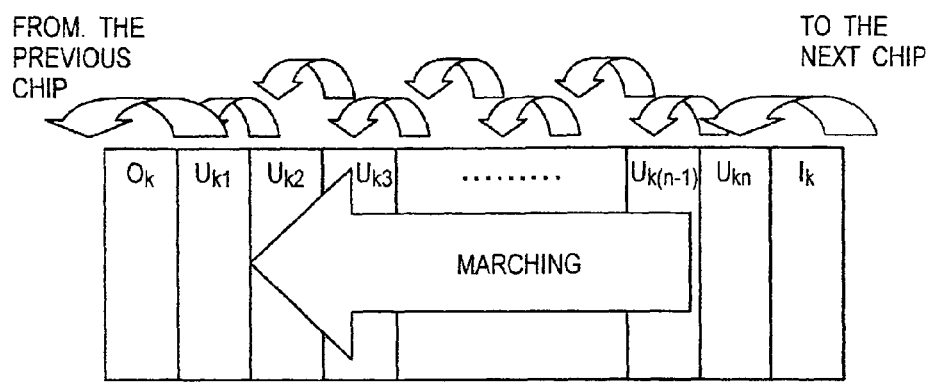
FIG. 18 illustrates an array of memory units on a semiconductor chip, focusing to a k-th row, which implements a part of a direct-transfer reverse marching memory pertaining to the embodiment of the present invention.

FIGS. 1-17 have illustrated the direct-transfer marching memory (forward marching memory) which stores the information of byte size or word size in each of memory units Uk1, Uk2, Uk3, . . . , Uk(n−1), Ukn. The k-th row in the array illustrated in FIG. 3 transfers the information of byte size or word size synchronously with the clock signal, step by step, from input-terminal column Ik toward the output-terminal column Ok, which is disposed at the right end of the array of the memory units Uk1, Uk2, Uk3, . . . , Uk(n−1), Ukn. FIG. 18 illustrates another scheme of direct-transfer marching memory.

In FIG. 18, each of the memory units Uk1, Uk2, Uk3, . . . , Uk(n−1), Ukn stores the information of byte size or word size, including word size of data or instructions, and transfers the information of byte size or word size synchronously in the reverse direction with the clock signal, step by step, toward the output-terminal column Ok disposed at the left end of the array of the memory units Uk1, Uk2, Uk3, ..., Uk(n−1), Ukn. The information may be provided from the processor with the resultant data executed in the processor through the input-terminal column Ik disposed at the right end of the array of the memory units Uk1, Uk2, Uk3, ..., Uk(n−1), Ukn.

Although the illustration is omitted, similar to the configuration already illustrated in FIG. 6, each of the bit-level cells in the memory units Uk1, Uk2, Uk3, ..., Uk(n−1), Ukn encompasses a substrate 11, one of substrate insulators 182$j$−2, 182$j$−1, 182$j$, 18$k$(2$j$+1) stacked on the substrate 11, one of floating-gate electrode 192$j$−2, 192$j$−1, 192$j$, 19$k$(2$j$+1) stacked on the substrate insulators 182$j$−2, 182$j$−1, 182$j$, 18$k$(2$j$+1) configured to accumulate cell-electrons so as to serve as the electron-storage regions, one of inter-electrode dielectrics 202$j$−2, 202$j$−1, 202$j$, 20$k$(2$j$+1) stacked on the floating-gate electrodes 192$j$−2, 192$j$−1, 192$j$, 19$k$(2$j$+1), and one of control-gate electrodes 222$j$−2, 222$j$−1, 222$j$, 22$k$(2$j$+1) stacked on the inter-electrode dielectrics 202$j$−2, 202$j$−1, 202$j$, 20$k$(2$j$+1). Portions of an insulator 26 inserted between the floating-gate electrode 192$j$−2 and the floating-gate electrode 192$j$−1, between the floating-gate electrode 192$j$−1 and the floating-gate electrode 192$j$, between the floating-gate electrode 192$j$ and the floating-gate electrode 192$j$+1, serve as an inter-unit dielectric through which cell-electrons can tunnel, respectively.

Similar to the forward direct-transfer marching memory illustrated in FIGS. 1-17, in the reverse direct-transfer marching memory illustrated in FIG. 18, the information of byte size or word size stored in each of the memory units Uk1, Uk2, Uk3, ..., Uk(n−1), Ukn is directly transferred by quantum tunneling along the horizontal data-transfer lines synchronously with triple phase control signals CLOCK1, CLOCK2, and CLOCK3, step by step, so as to establish a reverse marching behavior of the information of byte size or word size. However, as illustrated in FIGS. 19(a)-(c), to establish the reverse marching behavior by quantum tunneling, the waveforms of triple phase control signals CLOCK1, CLOCK2, and CLOCK3 are different from the clock signals for the forward direct-transfer marching memory.

In the reverse direct-transfer marching memory, the control signals CLOCK1, CLOCK2, and CLOCK3 are triple phase ternary clocks, respectively, each of which swings between trivalent levels of low (L), medium (M) and high (H) levels. The potential V2 across the high (H) and low (L) levels is determined so that an electric field large enough to cause quantum tunneling of the cell-electrons through the floating-gate electrode 192$j$−2 and the floating-gate electrode 192$j$−1, through the floating-gate electrode 192$j$−1 and the floating-gate electrode 192$j$, and through the floating-gate electrode 192$j$ and the floating-gate electrode 192$j$+1, respectively. The potential V1 across the medium (M) and low (L) levels is determined to be a half of the potential V2 so that an electric field not to cause quantum tunneling through the floating-gate electrode 192$j$−2 and the floating-gate electrode 192$j$−1, through the floating-gate electrode 192$j$−1 and the floating-gate electrode 192$j$, and through the floating-gate electrode 192$j$ and the floating-gate electrode 192$j$+1, respectively.

Figure 19:
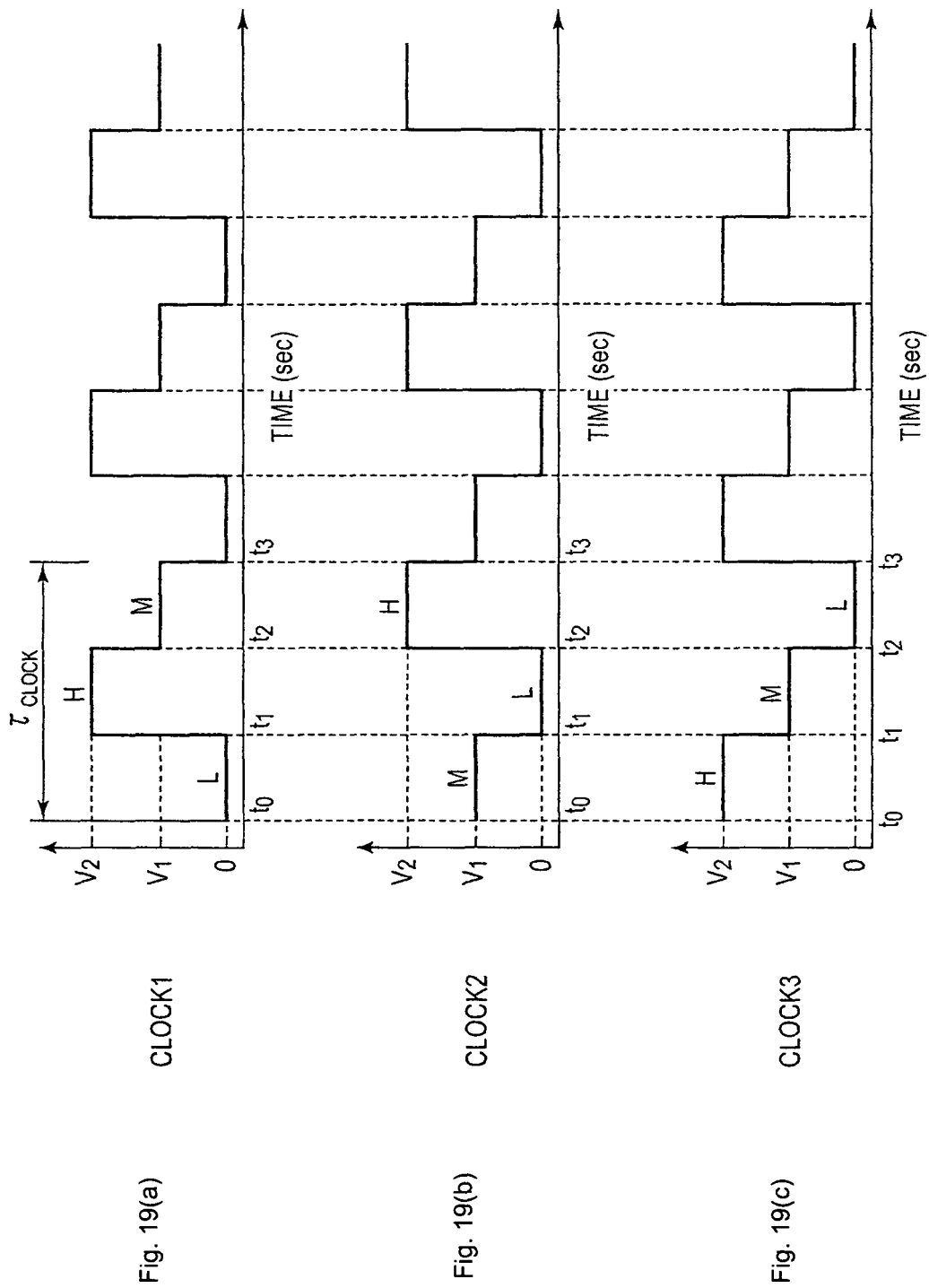
FIG. 19 (a) illustrates a trivalent waveform of a control signal CLOCK1, FIG. 19 (b) illustrates a trivalent waveform of a control signal CLOCK2.

As illustrated in FIG. 19 (a), at a time interval between t0 and t1, the first phase control signal CLOCK1 is at the low (L) level and, at time t1, the first phase control signal CLOCK1 rises in a stepwise fashion to the high (H) level and keeps at the H level up to the t2. At time t2, the first phase control signal CLOCK1 falls in a stepwise fashion to the medium (M) level and keeps at the M level up to the t3. At time t3, the first phase control signal CLOCK1 falls in a stepwise fashion to the L level. The time interval between t0 and t3 is defined as a ternary clock period tauclock. Then, in FIG. 19(a), t1−t0 (=t2−t1=t3−t2) is defined to be one-third of the clock period tauclock (=tauclock /3).

By contrast, as illustrated in FIG. 19 (b), at a time interval between t0 and t1, the second phase control signal CLOCK2 is at the M level and, at time t1, the second phase control signal CLOCK2 falls in a stepwise fashion to the L level and keeps at the L level up to the t2. At time t2, the second phase control signal CLOCK2 rises in a stepwise fashion to the H level, and keeps at the H level up to the t3. At time t3, the second phase control signal CLOCK2 falls in a stepwise fashion to the M level. Meanwhile, as illustrated in FIG. 19 (c), at a time interval between t0 and t1, the third phase control signal CLOCK3 is at the H level and, at time t1, the third phase control signal CLOCK3 falls in a stepwise fashion to the M level and keeps at the M level up to the t2. At time t2, the third phase control signal CLOCK3 falls in a stepwise fashion to the L level, and keeps at the L level up to the t3. At time t3, the third phase control signal CLOCK3 rises in a stepwise fashion to the H level.

According to the reverse-directional direct-transfer marching memory of the embodiment of the present invention illustrated in FIGS. 18 and 19, addressing to each of memory units Uk1, Uk2, Uk3, ..., Uk(n−1), Ukn disappears and required information is heading toward the output-terminal column Ok connected to the left end of the array. The mechanism of accessing the reverse-directional direct-transfer marching memory of the embodiment of the present invention is truly alternative to existing memory schemes that start from the addressing mode to read/write information. Therefore, according to the reverse-directional direct-transfer marching memory of the embodiment of the present invention, the memory-accessing without addressing mode is quite simpler than existing memory schemes.

Organization of Computer System

Figure 20:
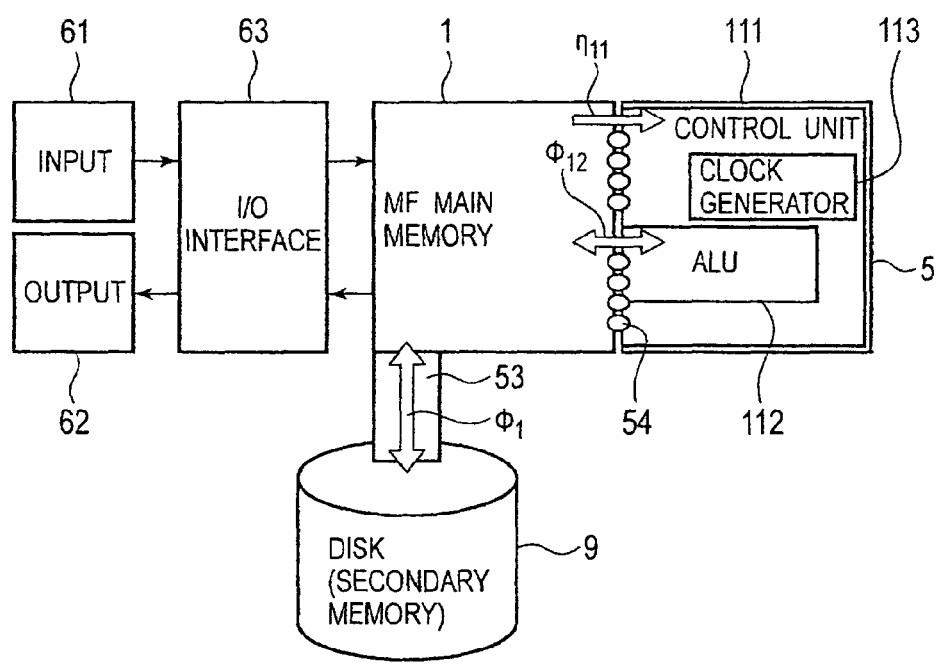
FIG. 20 illustrates a schematic block diagram illustrating a fundamental organization of a computer system, which uses the direct-transfer marching memory as a main memory, pertaining to an embodiment of the present invention.

As illustrated in FIG. 20, a computer system pertaining to an embodiment of the present invention encompasses a processor 5 and a marching flash (MF) main memory 1. Here, the MF main memory 1 is a main memory implemented by the above mentioned direct-transfer marching memory of the embodiment of the present invention or the direct-transfer marching main memory. The processor 5 includes a control unit 111 having a clock generator 113 configured to generate a clock signal and an arithmetic logic unit (ALU) 112 configured to execute arithmetic and logic operations synchronized with the clock signal. Although the illustration is omitted, similar to the configuration illustrated in FIG. 3, the MF main memory 1 encompasses an array of memory units Ul1, Ul2, Ul,2$j$, ..., Ul(n−1), Uln, ...; U(k−1)1, U(k−1)2, U(k−1),2$j$, ..., U(k−1)(n−1), U(k−1)n, ...; Uk1, Uk2, Uk,2$j$, ..., Uk(n−1), Ukn, ...; U(k+1)1, U(k+1)2, U(k+1),2$j$, ..., U(k+1)(n−1), U(k+1)n, ...; and Um1, Um2, Um,2$j$, ..., Um(n−1), Umn, each of memory units Ul1, Ul2, Ul,2$j$, ..., Ul(n−1), Uln, ...; U(k−1)1, U(k−1)2, U(k−1),2$j$, ..., U(k−1)(n−1), U(k−1)n, ...; Uk1, Uk2, Uk,2$j$, ..., Uk(n−1), Ukn, ...; U(k+1)1, U(k+1)2, U(k+1),2$j$, ..., U(k+1)(n−1), U(k+1)n, ...; and Um1, Um2, Um,2$j$, ..., Um(n−1), Umn having a unit of information including word size of data or instructions, input-terminal columns I1, ..., Ik−1, Ik, Ik+1, ..., Im and output-terminal columns O1, ..., Ok−1, Ok, Ok+1, ..., Om. In addition, the MF main memory 1 further encompasses the configuration of the reverse direct-transfer marching memory illustrated in FIG. 18 so as to implement a bi-directional direct-transfer marching memory.

Similar to the configuration illustrated in FIG. 3, the MF main memory 1 stores the information in each of memory units Ul1, Ul2, Ul,2$j$, ..., Ul(n−1), Uln, ...; U(k−1)1, U(k−1)2, U(k−1),2$j$, ..., U(k−1)(n−1), U(k−1)n, ...; Uk1, Uk2, Uk,2$j$, ..., Uk(n−1), Ukn, ...; U(k+1)1, U(k+1)2, U(k+1),2$j$, ..., U(k+1)(n−1), U(k+1)n, ...; and Um1, Um2, Um,2$j$, ..., Um(n−1), Umn and directly transfers the information synchronously by quantum tunneling with the clock signal, step by step, toward the output-terminal columns O1, ..., Ok−1, Ok, Ok+1, ..., Om so as to provide the processor 5 with the stored information actively and sequentially so that the ALU 112 can execute the arithmetic and logic operations with the stored information.

As illustrated in FIG. 20, the MF main memory 1 and the processor 5 are electrically connected by a plurality of joint members 54. For example, each of joint members 54 may be implemented by a first terminal pin attached to the MF main memory 1, a second terminal pin attached to the processor 5, and an electrical conductive bump interposed between the first and second terminal pins. For the material of the electrical conductive bumps, solder balls, gold (Au) bumps, silver (Ag) bumps, copper (Cu) bumps, nickel-gold (Ni—Au) alloy bumps, or nickel-gold-indium (Ni—Au—In) alloy bumps, etc. are acceptable.

The resultant data of the processing in the ALU 112 are sent out to the MF main memory 1 through the joint members 54. Therefore, as represented by bidirectional arrow PHI(Greek-letter)12, data are transferred bi-directionally between the MF main memory 1 and the processor 5 through the joint members 54. On the contrary, as represented by uni-directional arrow eta(Greek-letter)11, as to the instructions movement, there is only one way of instruction-flow from the MF main memory 1 to the processor 5.

As illustrated in FIG. 20, the organization of the computer system pertaining to the embodiment of the present invention further encompasses an external secondary memory 9 such as disk, an input unit 61, an output unit 62, and input/output (I/O) interface circuit 63. Similar to a conventional von Neumann computer, the signals or data are received by the input unit 61 and the signals or data are sent from the output unit 62. For instance, known keyboards and known mice can be considered as the input unit 6, while known monitors and printers can be considered as the output unit 62. Known devices for communication between computers, such as modems and network cards, typically serve for both the input unit 61 and the output unit 62. Note that the designation of a device as either the input unit 61 or the output unit 62 depends on the perspective. The input unit 61 takes as input physical movement that the human user provides and converts it into signals that the computer system pertaining to the embodiment of the present invention can understand. For example, the input unit 61 converts incoming data and instructions into a pattern of electrical signals in binary code that are comprehensible to the computer system pertaining to the embodiment of the present invention and the output from the input unit 61 is fed to the MF main memory 1 through the I/O interface circuit 63. The output unit 62 takes as input signals that the MF main memory 1 provides through the I/O interface circuit 63. The output unit 62 then converts these signals into representations that human users can see or read, reversing the process of the input unit 61, translating the digitized signals into a form intelligible to the user. The I/O interface circuit 63 is required whenever the processor 5 drives the input unit 61 and the output unit 62. The processor 5 can communicate with the input unit 61 and the output unit 62 through the I/O interface circuit 63. If in the case of different data formatted being exchanged, the I/O interface circuit 63 converts serial data to parallel form and vice-versa. There is provision for generating interrupts and the corresponding type numbers for further processing by the processor 5 if required.

The secondary memory 9 stores data and information on a more long-term basis than the MF main memory 1. While the MF main memory 1 is concerned mainly with storing programs currently executing and data currently being employed, the secondary memory 9 is generally intended for storing anything that needs to be kept even if the computer is switched off or no programs are currently executing. The examples of the secondary memory 9 are known hard disks (or hard drives) and known external media drives (such as CD-ROM drives). These storage methods are most commonly used to store the computer's operating system, the user's collection of software, and any other data the user wishes. While the hard drive is used to store data and software on a semi-permanent basis and the external media drives are used to hold other data, this setup varies wildly depending on the different forms of storage available and the convenience of using each. As represented by bidirectional arrow PHI(Greek-letter)1, data are transferred bi-directionally between the secondary memory 9 and the MF main memory 1 and the processor 5 through existing wire connection 53.

In the computer system of the embodiment of the present invention illustrated in FIG. 20, there are no buses consisting of the data bus and address bus because the whole computer system has no global wires even in any data exchange between the processor 5 and the MF main memory 1, while the wires or the buses implement the bottleneck in the conventional computer system. There are only short local wires within the MF main memory 1 or connecting portions of the MF main memory 1 with a corresponding ALU 112. As there are no global wires, which generate time delay and stray capacitances between these wires, the computer system of the embodiment of the present invention can achieve much higher processing speed and lower power consumption.

The architecture of the MF marching main memory 1 used in the computer system pertaining to the embodiment of the present invention is absolutely different from existing computer memory because the MF marching main memory 1 is purposely designed with functionality of storage and conveyance of information/data through all of memory units Ul1, Ul2, Ul,2$j$, ..., Ul(n−1), Uln, ...; U(k−1)1, U(k−1)2, U(k−1),2$j$, ..., U(k−1)(n−1), U(k−1)n, ...; Uk1, Uk2, Uk,2$j$, ..., Uk(n−1), Ukn, ...; U(k+1)1, U(k+1)2, U(k+1),2$j$, ..., U(k+1)(n−1), U(k+1)n, ...; and Um1, Um2, Um,2$j$, ..., Um(n−1), Umn in the MF marching main memory 1. The MF marching main memory 1 supplies information/data to the processor 5 at the same speed of the processor 5. In view of the time-domain relationship, the memory unit streaming time required for transferring information/data through one memory units Ul1, Ul2, Ul,2$j$, ..., Ul(n−1), Uln, ...; U(k−1)1, U(k−1)2, U(k−1),2$j$, ..., U(k−1)(n−1), U(k−1)n, ...; Uk1, Uk2, Uk,2$j$, ..., Uk(n−1), Ukn, ...; U(k+1)1, U(k+1)2, U(k+1),2$j$, ..., U(k+1)(n−1), U(k+1)n, ...; and Um1, Um2, Um,2$j$, ..., Um(n−1), Umn, in the MF marching main memory 1 is equal to the clock cycle in the processor 5.

The MF marching main memory 1 stores information/data in each of the memory units Ul1, Ul2, Ul,2$j$, ..., Ul(n−1), Uln, ...; U(k−1)1, U(k−1)2, U(k−1),2$j$, ..., U(k−1)(n−1), U(k−1)n, . . . ; Uk1, Uk2, Uk,2*j*, . . . , Uk(n−1), Ukn, . . . ; U(k+1)1, U(k+1)2, U(k+1),2*j*, . . . , U(k+1)(n−1), U(k+1)n, . . . ; and Um1, Um2, Um,2*j*, . . . , Um(n−1), Umn, and directly transfers synchronously by quantum tunneling with the clock signal, step by step, toward the output-terminal columns O1, . . . , Ok−1,Ok, Ok+1, . . . , Om, so as to provide the processor 5 with the stored information/data so that the arithmetic logic unit 112 can execute the arithmetic and logic operations with the stored information/data.

Figure 21:
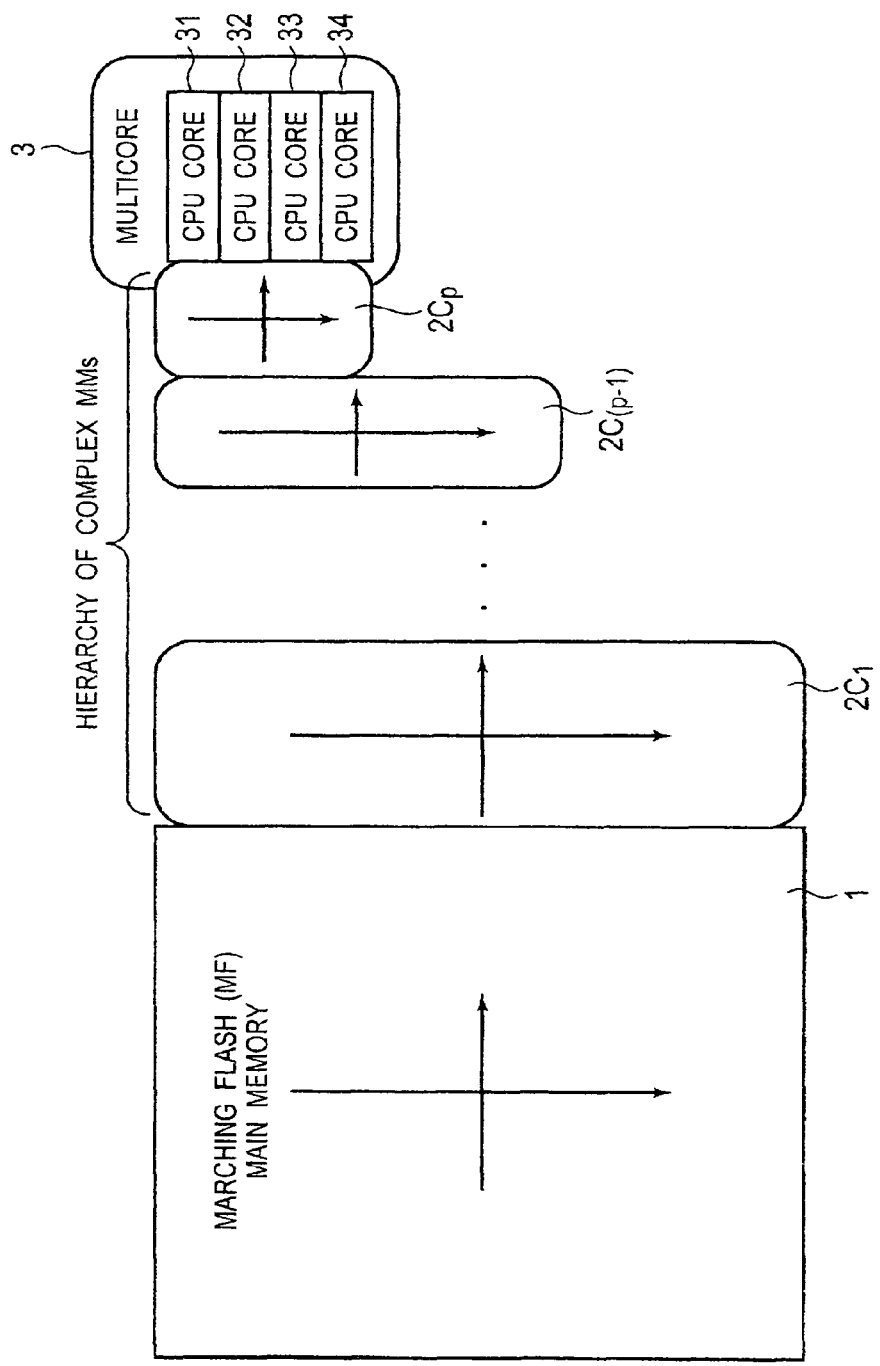
FIG. 21 illustrates a schematic block diagram illustrating another organization of a computer system having multicore processor, which uses the direct-transfer marching memory as a main memory, pertaining to an embodiment of the present invention.

As illustrated in FIG. 21, the direct-transfer marching memory computer system, in accordance with the embodiment of the present invention, may encompass a multicore processor 3 which includes a plurality of CPU cores 31, 32, 33, 34 configured to receive the required information through a hierarchy group of complex marching memories from the MF main memory 1. Here, 'the complex marching memory' encompasses a plurality of marching memory blocks being deployed spatially and each of the marching memory blocks includes an array of memory units, each of the memory units having a sequence of bit-level cells configured to store information of byte size or word size. Then, in the complex marching memory, each of the memory units transfers synchronously with a clock signal synchronized with the CPU's clock signal, step by step, toward an output side of corresponding marching memory block from an input side of the corresponding marching memory block and each of the marching memory blocks is randomly accessed so that each of the memory units in a subject marching memory block can be randomly accessed.

As illustrated in FIG. 21, the hierarchy group of complex marching memories is connected between the MF marching main memory 1 and CPU cores 31, 32, 33, 34. The hierarchy group of complex marching memories may include a complex marching-register file (RF) 2Cp such as marching-instruction RF and a marching-data RF connected to the pipelines 31, 32, 33, 34, a smallest level complex marching-cache memory 2C(p−1) in a multi-level caches architecture, such as a marching-instruction cache memory and a marching-data cache memory, and larger level complex marching-cache memory 2C1 in the multi-level caches architecture, for example. As the multicore processor 3 includes a plurality of CPU cores 31, 32, 33, 34, the information can move from MF marching main memory 1 to the larger level complex marching-cache memory 2C1 and from the larger level complex marching-cache memory 2C1 to the smallest level complex marching-cache memory 2C(p−1) and further from the smallest level complex marching-cache memory 2C(p−1) to the complex marching-register file (RF) 2Cp and from the complex marching-register file (RF) 2Cp to the CPU cores 31, 32, 33, 34.

In the direct-transfer marching memory computer system illustrated in FIG. 21, in accordance with the embodiment of the present invention, because all of the speeds of MF marching main memory 1, the larger level complex marching-cache memory 2C1, the smallest level complex marching-cache memory 2C(p−1), and the complex marching-register file (RF) 2Cp can be adjusted by own clock rate, respectively, all the timings in the computer system can be tuned.

Figure 22:
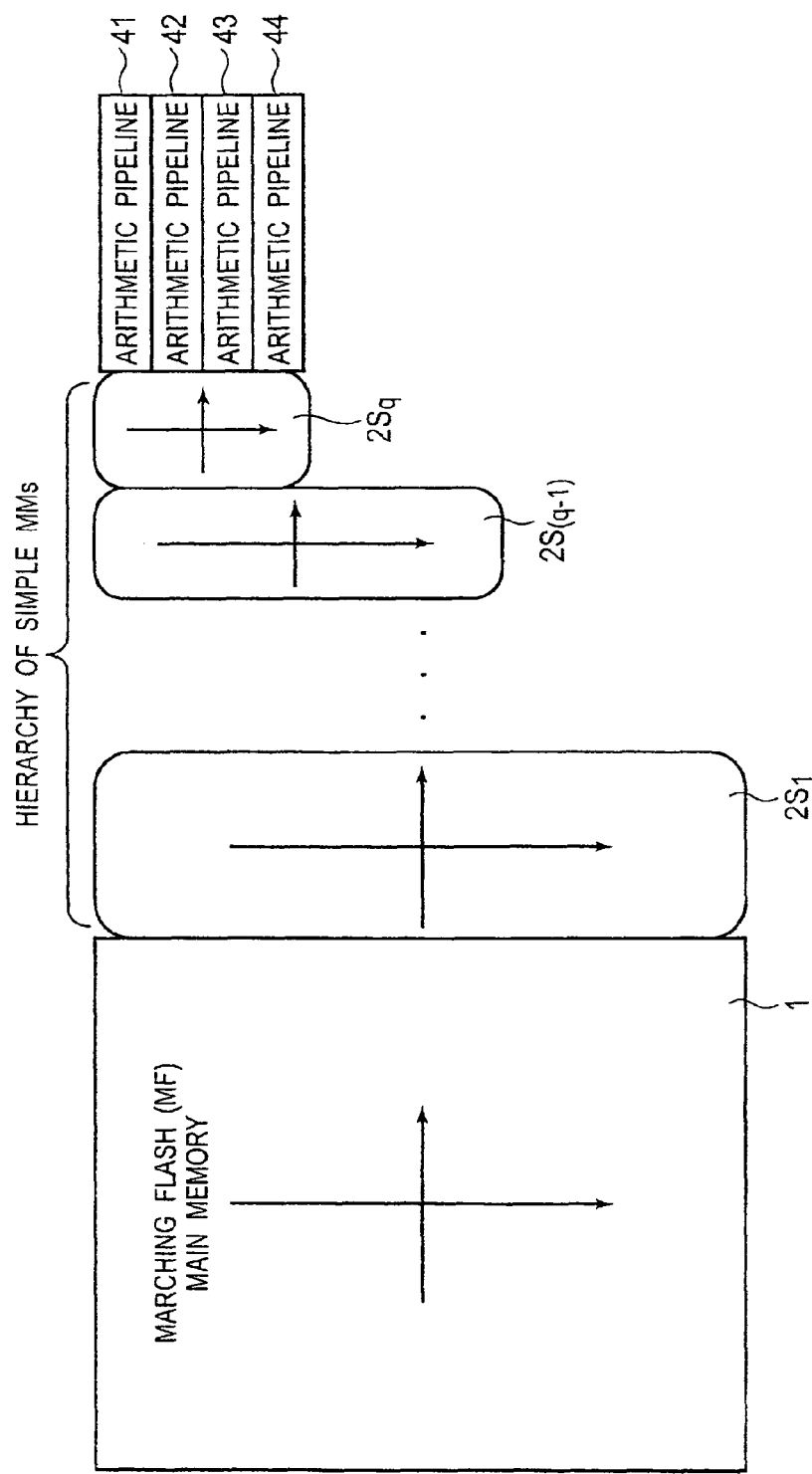
FIG. 22 illustrates a schematic block diagram illustrating a still another organization of a computer system having a plurality of arithmetic pipelines, which uses the direct-transfer marching memory as a main memory, pertaining to an embodiment of the present invention.

As illustrated in FIG. 22, the direct-transfer marching memory computer system, in accordance with the embodiment of the present invention, may encompass a processor 5 which includes a plurality of arithmetic pipelines 41, 42, 43, 44 configured to receive the required information through a hierarchy group of simple marching memories from the MF main memory 1. Here, 'the simple marching memory' may include any marching memory disclosed in PTL1.

Then, the hierarchy group of simple marching memories is connected between the MF marching main memory 1 and arithmetic pipelines 41, 42, 43, 44. The hierarchy group of simple marching memories may include a simple marching-register file (RF) 2Sq such as marching-instruction RF and a marching-data RF connected to the pipelines 41, 42, 43, 44, a smallest level simple marching-cache memory 2S(q−1) in a multi-level caches architecture, such as a marching-instruction cache memory and a marching-data cache memory, and larger level simple marching-cache memory 2S1 in the multi-level caches architecture, for example.

In the direct-transfer marching memory computer system illustrated in FIG. 22, in accordance with the embodiment of the present invention, because all of the speeds of MF marching main memory 1, the larger level simple marching-cache memory 2S1, the smallest level simple marching-cache memory 2S(q−1), and the simple marching-register file (RF) 2Sq can be adjusted by own clock rate, respectively, all the timings in the computer system can be tuned.

Other Embodiments

Various modifications will become possible for those skilled in the art after receiving the teaching of the present disclosure without departing from the scope thereof.

Figure 23:
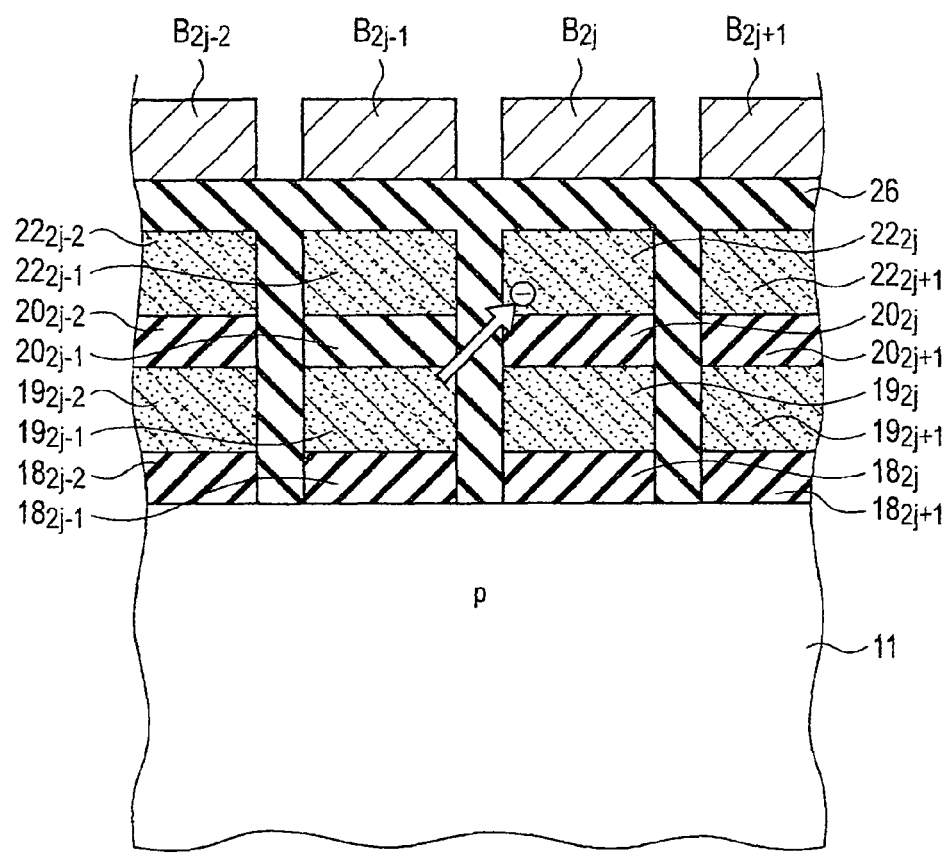
FIG. 23 illustrates a problem of a leakage tunneling in a schematic cross-sectional view of the arrays of bit-level cells, which corresponds to the cross-sectional view taken on line VI-VI in the plan view illustrated in FIG. 5.

For example, the structure illustrated in FIG. 6 is a mere example and other structures can be used for the configuration of each of the bit-level cells of a direct-transfer marching memory. Although the structure illustrated in FIG. 23 is exactly the same as the structure illustrated in FIG. 6, when the H level control signal is applied to the control-gate electrodes 222*j* through control line B2*j*, while the L level control signal is applied to the control-gate electrodes 222*j*−1 through control line B2*j*−1, there is a case that an electric field between the floating-gate electrode 192*j* and the control-gate electrodes 222*j* is higher than the electric field between the floating-gate electrode 192*j* and the floating-gate electrode 192*j*, because the potential of the floating-gate electrode 192*j* is established through a capacitive coupling between the control-gate electrodes 222*j* and the floating-gate electrode 192*j* via the inter-electrode dielectrics 202*j*. That is, when the capacitive coupling is relatively weak, and the potential of the floating-gate electrode 192*j* is not raised to an enough value for the tunneling, a leakage tunneling will be generated between the floating-gate electrode 192*j*−1 and the control-gate electrodes 222*j* if the thickness of the inter-electrode dielectrics 202*j* is thin.

Figure 24:
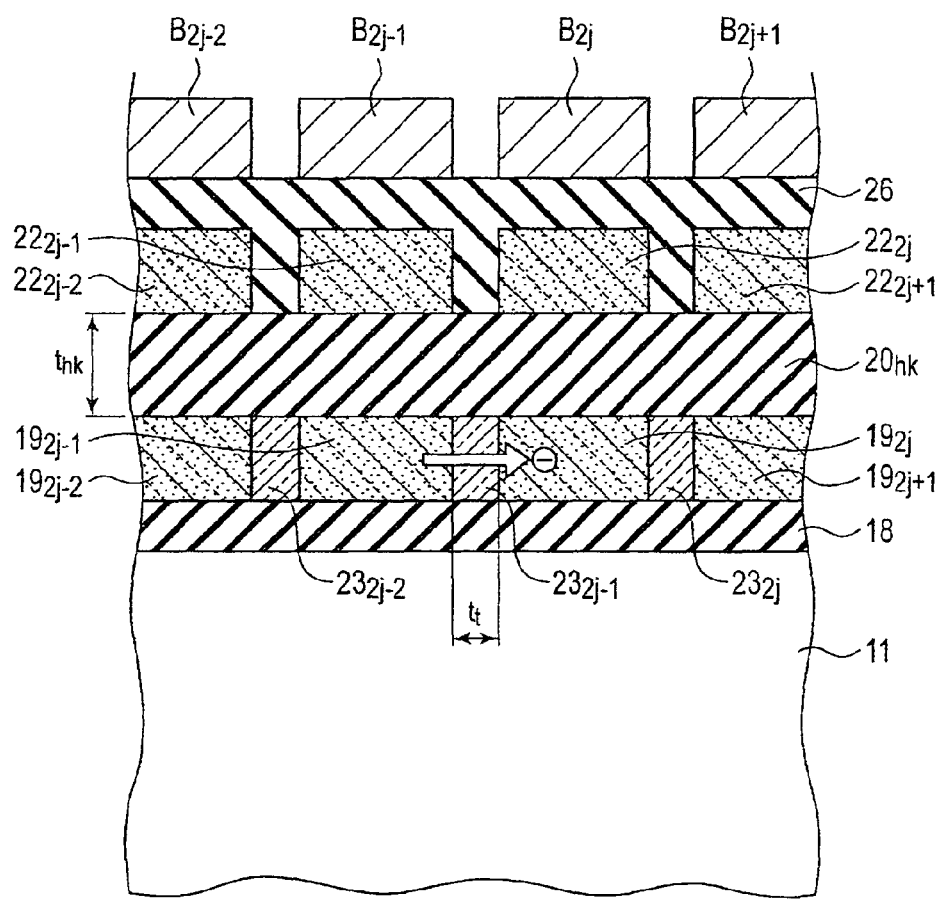
FIG. 24 illustrates a schematic cross-sectional view of an improved structure of the arrays of bit-level cells, which can protect the leakage tunneling illustrated in FIG. 23.

For protecting such leakage tunneling between the floating-gate electrode 192*j*−1 and the control-gate electrodes 222*j*, a structure illustrated in FIG. 24 may be preferable. The bit-level cells in a direct-transfer marching memory illustrated in FIG. 24, respectively, encompass a common substrate 11, a common blanket substrate insulators 18 stacked on the substrate 11, floating-gate electrodes 192*j*−2, 192*j*−1, 192*j*, 19*k*(2*j*+1) stacked on the common blanket substrate insulators 18 configured to accumulate cell-electrons so as to serve as the electron-storage regions, a common high-dielectric-constant insulator 20*hk* stacked on the floating-gate electrodes 192*j*−2, 192*j*−1, 192*j*, 19*k*(2*j*+1) serving as the inter-electrode dielectric, and control-gate electrodes 222*j*−2, 222*j*−1, 222*j*, 22*k*(2*j*+1) stacked on the common high-dielectric-constant insulator 20*hk*. A plurality of tunneling insulators 232*j*−2, 232*j*−1, 232*j* are inserted between the floating-gate electrode 192*j*−2 and the floating-gate electrode 192*j*–1, between the floating-gate electrode 192*j*–1 and the floating-gate electrode 192*j*, between the floating-gate electrode 192*j*, and the floating-gate electrode 192*j*+1 serve as an inter-unit dielectric through which cell-electrons can tunnel, respectively.

In the structure illustrated in FIG. 24, a thickness tt of the tunneling insulators 232*j*–2, 232*j*–1, 232*j* is set to be much less than the thickness thk of the common high-dielectric-constant insulator 20*hk*. Then, for example, the thickness tt of the tunneling insulators 232*j*–2, 232*j*–1, 232*j* is set to be less than three nanometers and the thickness thk of the common high-dielectric-constant insulator 20*hk* is set to be larger than 50 nanometers. More preferably, the thickness tt of the tunneling insulator is set to be less than two nanometers so as to achieve a higher tunneling probability through the tunneling insulators 232*j*–2, 232*j*–1, 232*j*. To each of the control-gate electrodes 222*j*–2, 222*j*–1, 222*j*, 22*k*(2*j*+1), one of the triple phase control signals CLOCK1, CLOCK2 and CLOCK3 is applied, respectively, so as to control the potentials of the corresponding floating-gate electrodes 192*j*–2, 192*j*–1, 192*j*, 19*k*(2*j*+1) through the common high-dielectric-constant insulator 20*hk*.

Although the SiO2 film can be used for the tunneling insulators 232*j*–2, 232*j*–1, 232*j*, a material that has a higher relative dielectric constant er than the SiO2 film is preferable for the common high-dielectric-constant insulator 20*hk*, considering the coupling capacitance relationship between the floating-gate electrodes 192*j*–2, 192*j*–1, 192*j*, 19*k*(2*j*+1) and the control-gate electrode 222*j*–2, 222*j*–1, 222*j*, 22*k*(2*j*+1). It is especially preferable that the material, which has an even higher relative dielectric constant than the relative dielectric constant er=5-5.5, the value is obtained for ONO film. For example, a single layer film made from any one of a strontium oxide (SrO) film with er=6, a silicon nitride (Si3N4) film with er=7, an aluminum oxide (Al2O3) film with er=8-11, a magnesium oxide (MgO) film with er=10, an yttrium oxide (Y2O3) film with er=16-17, a hafnium oxide (HfO2) film with er=22-23, a zirconium oxide (ZrO2) film with er=22-23, a tantalum oxide (Ta2O5) film with er=25-27, or a bismuth oxide (Bi2O3) film with er=40, or a compound film with multiple layers thereof may be used for the common high-dielectric-constant insulator 20*hk*. Ta2O5 and Bi2O3 lack thermal stability at the interface with the polycrystalline silicon (note that the values of the respective relative dielectric constants er exemplified here are apt to vary according to the fabrication method, possibly deviating from these values in some cases.).

Furthermore, it may be a compound film made from a silicon oxide film and the aforementioned films. The compound film may have a stacked structure of three layers or more. In other words, it is preferably an insulating film containing a material with the relative dielectric constant er of 6 or higher in at least a portion thereof. However, in the case of a compound film, selecting a combination that results in having an effective relative dielectric constant ereff of 6 or greater, measured for the entire film, is preferable. An effective relative dielectric constant ereff of less than 6 is approximately the same as that of the ONO film, whereby effects greater than those of the ONO film cannot be expected. Moreover, the common high-dielectric-constant insulator 20*hk* may also be an insulating film made from a ternary compound such as a hafnium aluminate (HfAlO) film. In other words, an oxide containing at least one of the following elements: strontium (Sr), aluminum (Al), magnesium (Mg), yttrium (Y), hafnium (Hf), zirconium (Zr), tantalum (Ta), and bismuth (Bi), or a silicon nitride containing these elements may be used as the common high-dielectric-constant insulator 20*hk*. It should be noted that a ferroelectric such as strontium titanate (SrTiO3) or barium strontium titanate (BaSrTiO3) is available as the high dielectric constant insulating film for the common high-dielectric-constant insulator 20*hk*. However, a lack in thermal stability of the ferroelectric at the interface with the polycrystalline silicon and hysteresis characteristics of the ferroelectric must be considered.

In a limiting case of miniaturization, when the feature sizes on the bit-level cells in the direct-transfer marching memory become smaller and smaller so as to increase the degree of on-chip integration, a single electron can be accumulated in the electron-storage region of the bit-level cell as 'the cell-electron' and the single cell-electron accumulated in one of the electron-storage regions in a subject memory unit can be directly transferred to an adjacent electron-storage region which is assigned in the next memory unit adjacent to the subject memory unit, the transfer of the single cell-electron is directly controlled by control signals, without using a combinational function of a logic gate circuit.

In addition, in the description of above embodiment, although the case in which the transfer of the cell-electrons is established by quantum tunneling of the cell-electrons through an insulator disposed between the one of the electron-storage regions and the adjacent electron-storage region is explained, the transfer of the cell-electrons can be established by another mechanism such as the classical electron transport mechanism, similar to the mechanism employed in CCD.

Thus, the present invention, of course, includes various embodiments and modifications and the like, which are not detailed above. Therefore, the scope of the present invention will be defined in the following claims.

The instant invention can be applied to industrial fields of various computer systems, which require higher speed and lower power consumption.

What is claimed is:

1. A direct-transfer marching memory including an array of memory units, each of the memory units having a sequence of bit-level cells so as to store information of byte size or word size, the information of byte size or word size is transferred synchronously, step by step, along a direction orthogonal to a direction of the sequence of bit-level cells, each of the bit-level cells comprising an electron-storage region configured to accumulate cell-electrons, wherein the cell-electrons accumulated in one of the electron-storage regions in a subject memory unit is directly transferred to an adjacent electron-storage region, which is assigned in the next memory unit adjacent to the subject memory unit, the transfer of the cell-electrons is directly controlled by control signals, without using a combinational function of a logic gate circuit.

2. The direct-transfer marching memory of claim 1, wherein the transfer of the cell-electrons is established by quantum tunneling of the cell-electrons, through an insulator disposed between the one of the electron-storage regions and the adjacent electron-storage region.

3. The direct-transfer marching memory of claim 2, wherein each of the bit-level cells comprises:
   a substrate;
   a substrate insulator stacked on the substrate;
   a floating-gate electrode serving as the electron-storage region, being stacked on the substrate insulator;
   an inter-electrode dielectric stacked on the floating-gate electrode; and a control-gate electrode stacked on the inter-electrode dielectric configured to be applied with one of the clock signals, wherein the cell-electrons accumulated in one of the floating-gate electrode in a subject memory unit among the array of memory units is directly transferred to an adjacent floating-gate electrode, which is assigned in the next memory unit adjacent to the subject memory unit, the transfer of the cell-electrons is established by the quantum tunneling of the cell-electrons through the insulator disposed between the one of the floating-gate electrode and the adjacent floating-gate electrode, the quantum tunneling is controlled by the control signals applied to the control-gate electrode.

4. The direct-transfer marching memory of claim 3, wherein the quantum tunneling is controlled by triple phase control signals applied respectively to three adjacent control-gate electrodes, which are assigned to each of three adjacent memory units, and the cell-electrons are accumulated in one of the floating-gate electrodes assigned to the three adjacent memory units, and a set of three adjacent floating-gate electrodes assigned to the three adjacent memory units proceeds toward a output terminal column, along a direction in which the information of byte size or word size is transferred synchronously with the triple phase control signals.

5. The direct-transfer marching memory of claim 4, wherein, in the set of three adjacent floating-gate electrodes, one of the floating-gate electrodes is assigned as a dummy cell, from which the cell-electrons are extracted at a previous timing of the triple phase control signals.

6. The direct-transfer marching memory of claim 5, wherein the dummy cell is assigned to a first floating-gate electrode, which is arrayed at a next allocation to a second floating-gate electrode in the set of three adjacent floating-gate electrodes, the cell-electrons accumulated in a third floating-gate electrode in the set of three adjacent floating-gate electrodes are transferred to the second floating-gate electrode.

7. A computer system comprising a processor and a direct-transfer marching main memory configured to provide the processor with stored information actively and sequentially so that the processor can execute arithmetic and logic operations with the stored information, the direct-transfer marching main memory including an array of memory units, each of the memory units having a sequence of bit-level cells so as to store information of byte size or word size, each of the bit-level cells comprising an electron-storage region configured to accumulate cell-electrons, wherein the cell-electrons accumulated in one of the electron-storage regions in a subject memory unit is directly transferred to an adjacent electron-storage region, which is assigned in the next memory unit adjacent to the subject memory unit, the transfer of the cell-electrons is directly controlled by control signals, without using a combinational function of a logic gate circuit.

8. The computer system of claim 7, wherein the transfer of the cell-electrons is established by quantum tunneling of the cell-electrons, through an insulator disposed between the one of the electron-storage regions and the adjacent electron-storage region.

9. The computer system of claim 8, wherein each of the bit-level cells comprises:
a substrate;
a substrate insulator stacked on the substrate;
a floating-gate electrode serving as the electron-storage region, being stacked on the substrate insulator;
an inter-electrode dielectric stacked on the floating-gate electrode; and
a control-gate electrode stacked on the inter-electrode dielectric configured to be applied with one of the clock signals, wherein the cell-electrons accumulated in one of the floating-gate electrode in a subject memory unit among the array of memory units is directly transferred to an adjacent floating-gate electrode, which is assigned in the next memory unit adjacent to the subject memory unit, the transfer of the cell-electrons is established by the quantum tunneling of the cell-electrons through the insulator disposed between the one of the floating-gate electrode and the adjacent floating-gate electrode, the quantum tunneling is controlled by the control signals applied to the control-gate electrode.

10. A direct-transfer marching memory comprising:
an array of memory units with each memory unit having a sequence of bit-level cells with each bit level cell having an electron-storage region configured to accumulate cell-electrons and storing byte size or word size information circuitry that transfers byte size or word size information synchronously, step by step along a direction orthogonal to a direction of the sequence of bit-level cells; and a source of control signals that directly transfer cell-electrons accumulated in an electron-storage region in a memory unit to an adjacent electron-storage region in the next adjacent memory unit without using a combinational function of a logic gate circuit.

11. The direct-transfer marching memory of claim 10, further including an insulator disposed between the one of the electron-storage regions and the adjacent electron-storage region, whereby the transfer of the cell-electrons is established by quantum tunneling of the cell-electrons.

12. The direct-transfer marching memory of claim 10, wherein:
(a) each of the bit-level cells includes:
(1) a substrate;
(2) a substrate insulator stacked on the substrate;
(3) a floating-gate electrode, serving as the electron-storage region, stacked on the substrate insulator;
(4) an inter-electrode dielectric stacked on the floating-gate electrode; and
(5) a control-gate electrode stacked on the inter-electrode dielectric to which a one of the control signals is conducted;
(b) the cell-electrons accumulated in one of the floating-gate electrodes in a memory unit among the array of memory units are directly transferred to an adjacent floating-gate electrode in the next memory unit in an adjacent memory unit;
(c) the transfer of the cell-electrons is established by quantum tunneling of the cell-electrons through the insulator disposed between the one of the floating-gate electrode and the adjacent floating-gate electrode; and
(d) the quantum tunneling is controlled by the control signals applied to the control-gate electrode.

13. The direct-transfer marching memory of claim 12, wherein:
(a) the quantum tunneling is controlled by triple phase control signals applied, respectively, to three adjacent control-gate electrodes of three adjacent memory units,
(b) the cell-electrons are accumulated in one of the floating-gate electrodes of the three adjacent memory units, and
(c) a set of three adjacent floating-gate electrodes of the three adjacent memory units proceeds toward an output terminal column, along a direction in which the information of byte size or word size is transferred synchronously with the triple phase control signals.

14. The direct-transfer marching memory of claim 13, wherein, in the set of three adjacent floating-gate electrodes, one of the floating-gate electrodes is a dummy cell from which the cell-electrons are extracted at a previous timing of the triple phase control signals.

15. The direct-transfer marching memory of claim 14, wherein:
  (a) the dummy cell is assigned to a first floating-gate electrode which is arrayed at a next allocation to a second floating-gate electrode in the set of three adjacent floating-gate electrodes,
  (b) the cell-electrons accumulated in a third floating-gate electrode in the set of three adjacent floating-gate electrodes are transferred to the second floating-gate electrode.

16. A computer system comprising:
  a processor; and
  a direct-transfer marching main memory:
  (a) configured to provide the processor with stored information actively and sequentially so that the processor can execute arithmetic and logic operations with the stored information, and
  (b) having:
    (1) an array of memory units with each memory unit having a sequence of bit-level cells with each bit level cell having an electron-storage region configured to accumulate cell-electrons and storing byte size or word size information
    (2) circuitry that transfers byte size or word size information synchronously, step by step along a direction orthogonal to a direction of the sequence of bit-level cells; and
    (3) a source of control signals that directly transfer cell-electrons accumulated in an electron-storage region in a memory unit to an adjacent electron-storage region in the next adjacent memory unit without using a combinational function of a logic gate circuit.

17. The computer system of claim 16, wherein the direct transfer marching memory further includes an insulator disposed between the one of the electron-storage regions and the adjacent electron-storage region, whereby the transfer of the cell-electrons is established by quantum tunneling of the cell-electrons.

18. The computer system of claim 17, wherein:
  (a) each of the bit-level cells includes:
    (1) a substrate;
    (2) a substrate insulator stacked on the substrate;
    (3) a floating-gate electrode, serving as the electron-storage region, stacked on the substrate insulator;
    (4) an inter-electrode dielectric stacked on the floating-gate electrode; and
    (5) a control-gate electrode stacked on the inter-electrode dielectric to which a one of the control signals is conducted;
  (b) the cell-electrons accumulated in one of the floating-gate electrodes in a memory unit among the array of memory units are directly transferred to an adjacent floating-gate electrode in the next memory unit in an adjacent memory unit;
  (c) the transfer of the cell-electrons is established by quantum tunneling of the cell-electrons through the insulator disposed between the one of the floating-gate electrode and the adjacent floating-gate electrode; and
  (d) the quantum tunneling is controlled by the control signals applied to the control-gate electrode.

* * * * *